(12) United States Patent
Larsen et al.

(10) Patent No.: US 10,750,296 B2
(45) Date of Patent: Aug. 18, 2020

(54) HEARING INSTRUMENT COMPRISING SWITCHED CAPACITOR DC-DC CONVERTER

(71) Applicant: GN HEARING A/S, Ballerup (DK)

(72) Inventors: Dennis Oland Larsen, Ballerup (DK); Ivan Harald Holger Jorgensen, Birkerod (DK); Martin Vinter, Ballerup (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 16/384,459

(22) Filed: Apr. 15, 2019

(65) Prior Publication Data
US 2019/0246223 A1 Aug. 8, 2019

Related U.S. Application Data

(63) Continuation of application No. 15/346,630, filed on Nov. 8, 2016, now Pat. No. 10,264,371.

(30) Foreign Application Priority Data

Nov. 3, 2016 (EP) .................. 16197041

(51) Int. Cl.
| H04R 25/00 | (2006.01) |
|---|---|
| H04R 25/02 | (2006.01) |
| H04R 25/04 | (2006.01) |
| H02M 3/07 | (2006.01) |
| H03F 3/183 | (2006.01) |
| H03F 3/217 | (2006.01) |

(52) U.S. Cl.
CPC ............ *H04R 25/602* (2013.01); *H02M 3/07* (2013.01); *H03F 3/183* (2013.01); *H03F 3/217* (2013.01); *H04R 25/00* (2013.01); *H04R 25/02* (2013.01); *H04R 25/04* (2013.01); *H03F 2200/03* (2013.01); *H04R 2225/31* (2013.01); *H04R 2225/59* (2013.01)

(58) Field of Classification Search
CPC ...... H04R 25/00; H04R 25/602; H04R 25/02; H04R 25/04; H04R 2225/31; H04R 2225/59; H02M 3/07; H03F 2200/03; H03F 3/183; H03F 3/217
See application file for complete search history.

(56) References Cited

U.S. PATENT DOCUMENTS

| 2005/0141741 A1* | 6/2005 | Van Oerle | H04R 25/505 381/323 |
|---|---|---|---|
| 2008/0159567 A1* | 7/2008 | Lesso | H02M 3/07 381/120 |
| 2009/0323378 A1* | 12/2009 | Melse | H02M 3/07 363/60 |
| 2009/0326624 A1* | 12/2009 | Melse | H02M 3/07 607/116 |

(Continued)

*Primary Examiner* — Yogeshkumar Patel
(74) *Attorney, Agent, or Firm* — Vista IP Law Group, LLP

(57) ABSTRACT

The present disclosure relates to a hearing instrument comprising a rechargeable battery source providing a battery supply voltage and a switched capacitor DC-DC converter comprising a DC input coupled to the battery supply voltage for converting the battery supply voltage into a higher or lower DC output voltage. The hearing instrument comprises at least one active circuit connected to the DC output voltage for energizing active components of the at least one active circuit.

22 Claims, 10 Drawing Sheets

(56) References Cited

U.S. PATENT DOCUMENTS

2015/0110321 A1\* 4/2015 Siegumfeldt ........ H04R 25/407
                                                                                                         381/323
2018/0097486 A1\* 4/2018 Salem ...................... H03F 3/72

\* cited by examiner

HEARING INSTRUMENT COMPRISING SWITCHED CAPACITOR DC-DC CONVERTER

RELATED APPLICATION DATA

This application is a continuation of U.S. patent application Ser. No. 15/346,630 filed on Nov. 8, 2016, issued as U.S. Pat. No. 10,264,371, which claims priority to, and the benefit of, European patent application No. 16197041.3 filed on Nov. 3, 2016. The entire disclosure of the above application is expressly incorporated by reference herein.

FIELD

The present disclosure relates to a hearing instrument comprising a rechargeable battery source providing a battery supply voltage and a switched capacitor DC-DC converter comprising a DC input coupled to the battery supply voltage for converting the battery supply voltage into a higher or lower DC output voltage. The hearing instrument comprises at least one active circuit connected to the DC output voltage for energizing active components of the at least one active circuit.

BACKGROUND

Switched capacitor DC-DC power converters are known in the art and have previously been applied in various types of portable communication devices. Switched capacitor DC-DC power converters are utilized to convert a DC input voltage from an energy or power source, such as a rechargeable battery, of the portable device into a higher or lower DC output voltage suitable for powering various types of integrated circuits and other active components. Switched capacitor DC-DC power converters possess certain attractive properties compared to their inductor-based counterparts—for example a relatively low level of EMI, because there is not stored energy in magnetic fields of inductors. Switched capacitor DC-DC power converters may have small size and high energy conversion efficiency. Different topologies of switched capacitor DC-DC power converters are capable of providing DC voltage step-up (i.e. boost) and DC voltage step-down (i.e. buck) with a topology dependent optimum voltage conversion ratio for example 1:2 or 1:3 step-up conversion and 2:1 and 3:1 step-down conversion.

SUMMARY

It may be desirable to provide switched capacitor DC-DC power converters with improved performance characteristics such as higher power conversion efficiency across a wide range of loads, even further reduction of electromagnetic noise emission, reduced voltage ripple on the DC output voltage, improved source regulation and improved load regulation etc. Switched capacitor DC-DC converters are highly useful for powering hearing instruments where the compact dimensions of the housing or custom shell in conjunction with small battery capacity typically place severe constraints on size, power conversion efficiency and electromagnetic emissions of the power supply circuitry. Furthermore, magnetic field emissions generated by magnetics/inductor based DC-DC power converters are prone to disturb RF signal receipt and transmission of RF wireless transceivers present in the hearing instrument.

A first aspect relates to a hearing instrument comprising: a rechargeable battery source providing a battery supply voltage. The hearing instrument comprises a switched capacitor DC-DC converter comprising a DC input coupled to the battery supply voltage for converting the battery supply voltage into a higher or lower DC output voltage. At least one active circuit of the hearing instrument is connected to the DC output voltage for energizing active components of the at least one active circuit.

The hearing instrument may comprise a housing or shell according to any known housing style such as Behind-the-Ear (BTE), In-the-Ear (ITE), In-the-Canal (ITC), Completely-in-Canal (CIC) etc. The hearing instrument may comprise one or several microphone(s) for picking-up sound from the external environment of the hearing instrument and generate a first audio signal in response.

The least one active circuit may comprise a plurality of active circuits, or circuit blocks, configured to carry out respective processing functions of the hearing instrument such as amplifying, compressing, filtering, beamforming one or more audio signals, e.g. speech or music, picked-up by the microphone or microphone of the hearing instrument. The least one active circuit may comprise a plurality of interconnected transistors forming a digital logic circuit or an analog circuit or a combination of both. The least one active circuit may comprise a class D output amplifier as discussed in further detail below.

The rechargeable battery source may comprise at least one Li-Ion battery cell delivering the battery supply voltage to the DC input of the switched capacitor DC-DC converter. Since, Li-Ion battery cells supply a nominal battery voltage at around 4.0 V, the switched capacitor DC-DC converter may be configured to step-down the batter supply voltage with a factor of 2:1 and/or 3:1, depending on a charging state of the at least one Li-Ion battery cell, to supply a DC output voltage of about 1.2 V to the least one active circuit of the hearing instrument. The latter voltage at around 1.2 V is often optimal or near-optimal for the class D output amplifier and other active circuits of the hearing instrument as discussed below. However, the skilled person will understand the switched capacitor DC-DC converter may be configured to step-up the batter supply voltage with certain ratios, e.g. 1:2 and/or 1:3, for other types of rechargeable battery sources delivering nominal battery voltages below 1.2 V.

The least one active circuit of the hearing instrument may comprise a control and processing circuit which comprises: a first audio input channel for receipt of the first audio signal, a signal processor for receipt and processing of the audio signal for generating a compensated microphone signal according to a hearing loss of a user; wherein the compensated microphone signal is applied to an audio input of the class D output amplifier for generation of a modulated output signal at a predetermined modulation frequency for application to a miniature receiver or loudspeaker.

The signal processor of the hearing instrument may comprise dedicated digital logic circuitry, a software programmable processor or any combination thereof. As used herein, the terms "processor", "signal processor", "controller", "system", etc., are intended to refer to microprocessor or CPU-related entities, either hardware, a combination of hardware and software, software, or software in execution. For example, a "processor", "signal processor", "controller", "system", etc., may be, but is not limited to being, a process running on a processor, a processor, an object, an executable file, a thread of execution, and/or a program. By way of illustration, the terms "processor", "signal processor", "controller", "system", etc., designate both an application running on a processor and a hardware processor. One or more "processors", "signal processors", "controllers", "systems" and the like, or any combination hereof, may reside within a process and/or thread of execution, and one or more "processors", "signal processors", "controllers", "systems", etc., or any combination hereof, may be localized on one hardware processor, possibly in combination with other hardware circuitry, and/or distributed between two or more hardware processors, possibly in combination with other hardware circuitry. Also, a processor (or similar terms) may be any component or any combination of components that is capable of performing signal processing. For examples, the signal processor may be an ASIC processor, a FPGA processor, a general purpose processor, a microprocessor, a circuit component, or an integrated circuit.

The hearing instrument may comprise a wireless receiver coupled to the first audio input channel for receipt of a wireless modulated audio signal and a decoder coupled to the wireless receiver for extracting a wireless audio signal and coupling the wireless audio signal to the first audio input channel or a second audio input The wireless receiver may comprise an appropriate antenna for the selected type of wireless transmission such as an RF antenna or a magnetic antenna. The RF antenna may for example be configured for receipt of a wireless modulated audio signal according to the Bluetooth standard or the Bluetooth Low energy (Bluetooth LE) standard. Alternatively, a much lower frequency of communication may be applied for example based on magnetic coupling in which case the magnetic antenna may comprise a traditional telecoil.

The hearing instrument may additionally comprise an output transducer, such as a receiver, loudspeaker, implanted electrode transducer etc., configured to supply the modulated output signal based on the hearing loss compensated microphone signal. The auditory output signal is perceived by the hearing instrument user's auditory system as sound.

A preferred embodiment of the switched capacitor DC-DC converter comprises:
a clock generator configured to generate a clock signal,
a charge pump circuit comprising a switch array driven by first and second non-overlapping clock phases derived from the clock signal; said switch array configured to, in a first clock phase, charge a flying capacitor from the DC input voltage and, in a second clock phase, discharge the flying capacitor into an output capacitor connected to the DC output voltage. The switched capacitor DC-DC converter additionally comprises an output voltage regulator which comprises:
a reference voltage input for receipt of a DC reference voltage and a feedback voltage input for receipt of a feedback voltage representative of the DC output voltage,
an error signal generator configured to combine the DC reference voltage and the feedback voltage to determine a control signal,
a loop filter configured for receipt and lowpass filtering of the control signal to generate a lowpass filtered control signal,
a multi-level quantizer configured to convert the lowpass filtered control signal into a corresponding digital control signal at a predetermined sampling frequency,
a switch array controller configured to generate the first and second non-overlapping clock phases for the charge pump circuit based on the clock signal and digital control signal.

The sampling frequency of the multi-level quantizer may lie above 500 kHz for example between 1 MHz and 8 MHz. According to one embodiment of the switched capacitor DC-DC converter, the predetermined sampling frequency of the multi-level quantizer equals to two times a maximum clock frequency of the clock signal which drives the charge pump circuit via the first and second non-overlapping clock phases. The charge pump circuit may transfer charge to the DC output voltage, and to a smoothing or output capacitor connected thereto, on both rising and falling edges of the clock signal. This means that voltage ripple on the DC output voltage comprises frequency components located at two times the maximum clock frequency of the clock signal and harmonics thereof. In certain advantageous embodiments, the multi-level quantizer may be sampled synchronously to the clock signal to suppress aliasing products associated with the sampling of the lowpass filtered control signal.

The multi-level quantizer, aka A/D converter, may comprise between 2 and 16 quantization levels depending on the requirements of a particular application for accuracy, circuit complexity and power consumption.

The switch array may comprise a plurality of controllable semiconductor switches selectively connecting one or more flying capacitors to the DC input voltage and charging the one or more flying capacitor(s) and alternatingly discharging the one or more flying capacitor(s) into the output capacitor at the DC output voltage. Certain embodiments of the switch array may comprise at least one flying capacitor and a first controllable semiconductor switch connected between the DC input voltage and a positive terminal of the flying capacitor;
a second controllable semiconductor switch connected between a negative terminal of the flying capacitor and one of a negative DC supply rail, such as ground, and the DC output voltage;
a third controllable semiconductor switch connected between a negative terminal of the flying capacitor and the negative DC supply rail;
a fourth controllable semiconductor switch connected between the positive terminal of the flying capacitor and the DC output voltage; wherein
the first and second controllable semiconductor switches are switched between respective on-states and off-states in accordance with the first clock phase and the third and fourth controllable semiconductor switches are switched between respective on-states and off-states in accordance with the second clock phase.

The loop filter may comprise an analog lowpass filter and/or a discrete time lowpass filter such as a switched capacitor lowpass filter. The skilled person will understand that the loop filter and the error signal generator may be integrally formed for example as a differential input switched capacitor filter configured to subtracting the DC reference voltage and the feedback voltage and to lowpass filtering the control signal as discussed in additional detail below with reference to the appended drawings.

The loop filter preferably comprises a so-called proportional integral filter such that a transfer function of the loop filter comprises a lowpass pole at a first corner frequency of the transfer function. The first corner frequency may be smaller than 200 Hz, such as smaller than 100 Hz, or smaller than 10 Hz, to approximate the functionality of a true integrator. The transfer function of the loop filter may in certain embodiments also comprise and a zero at a second corner frequency. The second corner frequency is preferably significantly higher than the first corner frequency for example at least 20 times higher such as more than 100 times higher. The second corner frequency may be located above the audio bandwidth—for example above 20 kHz. The transfer function of one embodiment of the loop filter has the first corner frequency located at 50 Hz and the second corner frequency located at 26 kHz.

A number of useful embodiments of the switched capacitor DC-DC converter comprise a plurality of controllable semiconductor switches which possess adjustable on-resistance or conductance. One such embodiment of the switched capacitor DC-DC converter comprises first and second controllable semiconductor switches which each comprises a plurality of individually controllable switch segments driven by first and second sets of switch segment control signals, respectively, derived from the first clock phase; and each of the third and fourth controllable semiconductor switches comprises a plurality of individually controllable switch segments driven by third and fourth sets of switch segment control signals, respectively, derived from the second clock phase. One or more of the controllable semiconductor switches of the switch array may each comprise between 2 and 16 individually controllable switch segments. The respective resistances of the plurality of individually controllable switch segments may be substantially identical or they may differ—for example following a binary weighted scheme.

The output voltage regulator may be configured to, for one or more of the first, second, third and fourth controllable semiconductor switches, selecting respective segment subsets of the plurality of individually controllable switch segments in accordance with an amplitude of the digital control signal. The output voltage regulator may for example be configured to selecting the respective switch segment subsets such that a conductance of each of the one or more of the first, second third and fourth controllable semiconductor switches, in its on-state, tracks the amplitude of the digital control signal for example increasing the number of active switch segments, i.e. conducting switch segments, of the plurality of individually controllable switch segments with increasing amplitude of the digital control signal, and possibly vice versa, to increase charge transfer to the DC output voltage and counteract the increase of the amplitude of the digital control signal. The increasing amplitude of the digital control signal indicates an increasing output voltage error at the DC output voltage and vice versa for decreasing amplitude of the digital control signal. The skilled person will understand that a segment subset at some time instances may comprise all of the individually controllable switch segments to maximize the conductance of the controllable semiconductor switch in question.

One attractive variant of the switched capacitor DC-DC converter comprises a plurality of controllable semiconductor switches that are switched on and switched off in a gradual or stepwise manner by sequentially activating the switch segments in connection with a state switching of the controllable semiconductor switch. According to one such embodiment, the output voltage regulator is configured to:
- switch between on-states and off-states of the first controllable semiconductor switch by sequentially turn-on and turn-off the plurality of individually controllable switch segments via the first set of switch segment control signals; and/or
- switch between on-states and off-states of the second controllable semiconductor switch by sequentially turn-on and turn-off the plurality of individually controllable switch segments via the second set of switch segment control signals; and/or
- switch between on-states and off-states of the third controllable semiconductor switch by sequentially turn-on and turn-off the plurality of individually controllable switch segments via the third set of switch segment control signals; and/or
- switch between on-states and off-states of the fourth controllable semiconductor switch by sequentially turn-on and turn-off the plurality of individually controllable switch segments via the fourth set of switch segment control signals.

The output voltage regulator may be configured to, for the one or more of the first, second third and fourth controllable semiconductor switches:
toggling the first and second clock phases in response to the amplitude of the digital control signal is incremented from a current quantization level to a larger quantization level; and
selecting respective segment subsets of the plurality of individually controllable switch segments in accordance with the amplitude of the digital control signal.

According to yet another embodiment of the switched capacitor DC-DC converter, the clock generator is configured to generate a predefined set of individually selectable fixed clock frequencies such as at least two fixed clock frequencies for example between two and eight fixed clock frequencies. According to this embodiment, the individually selectable fixed clock frequencies may be generated by a programmable or adjustable clock generator and the latter controlled by the output voltage regulator. The output voltage regulator may be configured to switch between these individual clock frequencies of the predefined set of fixed clock frequencies in accordance with the level or amplitude of the digital control signal to provide a control mechanism for adjusting the DC output voltage of the switched capacitor DC-DC converter. The output voltage regulator may for example increase the clock frequency for increasing amplitude of the digital control signal and decrease the clock frequency for decreasing amplitude of the digital control signal as discussed in additional detail below with reference to the appended drawings.

The provision of this predefined set of fixed clock enables system level frequency planning where the switched capacitor DC-DC converter only generates ripple voltage disturbances at frequencies where the remaining portion of the system, e.g. the at least one active circuit block, is insensitive to noise, or at least exhibits, a reduced sensitivity to noise for example residing on the DC output voltage or picked-up as electromagnetic waves, i.e. EMI disturbances. The output voltage regulator may be configured to select a clock frequency from the predefined set of fixed clock frequencies in accordance with a predetermined modulation frequency of the previously mentioned class D output amplifier coupled to the DC output voltage of the switched capacitor DC-DC converter for power supply. This is beneficial because class D output amplifiers typically possess relatively poor power supply rejection ratio (PSRR) due to a noise shaping mechanism pushing a high level of quantization noise above the audio band in the noise-shaped output signal as discussed in additional detail below with reference to the appended drawings. According to one such embodiment of the output voltage regulator, each clock frequency of the predefined set of fixed clock frequencies is an integer multiple of the predetermined modulation frequency of the class D output amplifier. The modulation frequency of class D output amplifier may for example be set to 250 kHz and the predefined set of fixed clock frequencies of the output voltage regulator comprising at least 250 kHz, 500 kHz and 1 MHz or at least 500 kHz, 1 MHz and 1.5 MHz. The skilled person will understand that the clock signal of the switched capacitor DC-DC converter preferably is synchronous to a clock signal setting the predetermined modulation frequency of the class D output amplifier to maintain a well-defined relationship between the switching frequencies of the switched capacitor DC-DC converter and the modulation frequency of class D output amplifier despite temperature variations and component drift etc.

The individual clock frequencies of the predefined set of fixed clock frequencies may be related by integer ratios such as 2, 3, 4, 8 etc. The predefined set of fixed clock frequencies may e.g. comprise 500 kHz and 1 MHz or comprise 250 kHz, 500 kHz, 1 MHz and optionally 2 MHz.

The output voltage regulator may adhere to a predetermined table or predetermined rule specifying a coupling between the amplitude of the digital control signal, the predefined set of fixed clock frequencies and the active switch segment subset of each of the controllable semiconductor switches. In one such embodiment the output voltage regulator comprises a predetermined table or predetermined rule mapping each amplitude of the digital control signal to a particular combination of clock frequency, selected from predefined set of individually selectable fixed clock frequencies, and switch segment subsets of the plurality of individually controllable switch segments. The skilled person will understand that this predetermined table or predetermined rule may be implemented by a suitably configured digital state machine of the switch array controller.

A second aspect relates to a switched capacitor DC-DC converter configured for converting a DC input voltage into a higher or lower DC output voltage. The switched capacitor DC-DC converter comprising:
a clock generator configured to generate a clock signal,
a charge pump circuit comprising a switch array driven by first and second non-overlapping clock phases derived from the clock signal; said switch array configured to, in a first clock phase, charge a flying capacitor from the DC input voltage and, in a second clock phase, discharge the flying capacitor into an output capacitor connected to the DC output voltage. The switched capacitor DC-DC converter further comprises an output voltage regulator which comprises:
a reference voltage input for receipt of a DC reference voltage and a feedback voltage input for receipt of a feedback voltage representative of the DC output voltage,
an error signal generator configured to combine the DC reference voltage and the feedback voltage to determine a control signal,
a loop filter configured for receipt and lowpass filtering of the control signal to generate a lowpass filtered control signal,
a multi-level quantizer configured to convert the lowpass filtered control signal into a corresponding digital control signal at a predetermined sampling frequency,
a switch array controller configured to generate the first and second non-overlapping clock phases for the charge pump circuit based on the clock signal and digital control signal.

A hearing instrument includes: a rechargeable battery source providing a battery supply voltage; a switched capacitor DC-DC converter comprising a DC input configured to receive the battery supply voltage, wherein the converter is configured for converting the battery supply voltage into a higher or lower DC output voltage; and at least one active circuit configured to receive the DC output voltage for energizing active components of the at least one active circuit.

Optionally, the least one active circuit comprises a class D output amplifier.

Optionally, the hearing instrument further includes a control and processing circuit comprising: a first audio input channel for receipt of a first audio signal, and a signal processor for processing of the first audio signal for generating a compensated microphone signal according to a hearing loss of a user; wherein the compensated microphone signal is for application to an audio input of the class D output amplifier for generation of a modulated output signal at a predetermined modulation frequency for application to a receiver or speaker.

Optionally, the switched capacitor DC-DC converter comprises: a clock generator configured to generate a clock signal, and a charge pump circuit comprising a switch array driven by first and second non-overlapping clock phases derived from the clock signal.

Optionally, the switch array is configured to, in the first clock phase, charge a capacitor and, in the second clock phase, discharge the capacitor.

Optionally, the switched capacitor DC-DC converter further comprises an output voltage regulator.

Optionally, the output voltage regulator comprises a reference voltage input for receipt of a DC reference voltage, and a feedback voltage input for receipt of a feedback voltage representative of the DC output voltage.

Optionally, the output voltage regulator further comprises an error signal generator configured to combine a DC reference voltage and a feedback voltage to determine a control signal.

Optionally, the output voltage regulator further comprises a loop filter configured for lowpass filtering the control signal to generate a lowpass filtered control signal.

Optionally, the output voltage regulator further comprises a multi-level quantizer configured to convert the lowpass filtered control signal into a corresponding digital control signal at a predetermined sampling frequency.

Optionally, the output voltage regulator further comprises a switch array controller configured to generate the first and second non-overlapping clock phases for the charge pump circuit based on the clock signal and a digital control signal.

Optionally, the clock generator is configured to generate a predefined set of fixed clock frequencies.

Optionally, the output voltage regulator is configured to select a clock frequency from the predefined set of fixed clock frequencies in accordance with a predetermined modulation frequency of a class D output amplifier.

Optionally, each clock frequency of the predefined set of fixed clock frequencies is an integer multiple of the predetermined modulation frequency of the class D output amplifier.

Optionally, the clock signal of the switched capacitor DC-DC converter is synchronous to another clock signal that sets the predetermined modulation frequency of the class D output amplifier.

Optionally, the rechargeable battery source comprises at least one Li-Ion battery cell.

Optionally, the switched capacitor DC-DC converter further comprises a multi-level quantizer, and wherein a predetermined sampling frequency of the multi-level quantizer is equal to two times a clock frequency of the clock signal.

Optionally, the switch array of the charge pump circuit comprises a first controllable semiconductor switch and a second controllable semiconductor switch configured to be driven by the first clock phase, and wherein the switch array also comprises a third controllable semiconductor switch and a fourth controllable semiconductor switch configured to be driven by the second clock phase.

Optionally, the first and second controllable semiconductor switches respectively comprise a first plurality of individually controllable switch segments and a second plurality of individually controllable switch segments driven respectively by first and second sets of switch segment control signals derived from the first clock phase; and wherein the third and fourth controllable semiconductor switches respectively comprise another a third plurality of individually controllable switch segments and a fourth plurality of individually controllable switch segments driven respectively by third and fourth sets of switch segment control signals derived from the second clock phase.

Optionally, the output voltage regulator is configured to, for one or more of the first, second, third and fourth controllable semiconductor switches, select respective one(s) of the first, second, third, and fourth plurality of individually controllable switch segments in accordance with an amplitude of a digital control signal.

Optionally, the output voltage regulator is configured to: switch between an on-state and an off-state of the first controllable semiconductor switch by sequentially turning-on and turning-off the first plurality of individually controllable switch segments via the first set of switch segment control signals; and/or switch between an on-state and an off-state of the second controllable semiconductor switch by sequentially turning-on and turning-off the second plurality of individually controllable switch segments via the second set of switch segment control signals; and/or switch between an on-state and an off-state of the third controllable semiconductor switch by sequentially turning-on and turning-off the third plurality of individually controllable switch segments via the third set of switch segment control signals; and/or switch between an on-state and an off-state of the fourth controllable semiconductor switch by sequentially turning-on and turning-off the fourth plurality of individually controllable switch segments via the fourth set of switch segment control signals.

Optionally, the output voltage regulator is configured to switch between individual clock frequencies of a predefined set of fixed clock frequencies in accordance with an amplitude of a digital control signal.

Other features, advantageous, and/or embodiments will be described in the detailed description.

BRIEF DESCRIPTION OF THE DRAWINGS

Embodiments will be described in more detail in connection with the appended drawings, in which.

DESCRIPTION OF EMBODIMENTS

Figure 1:
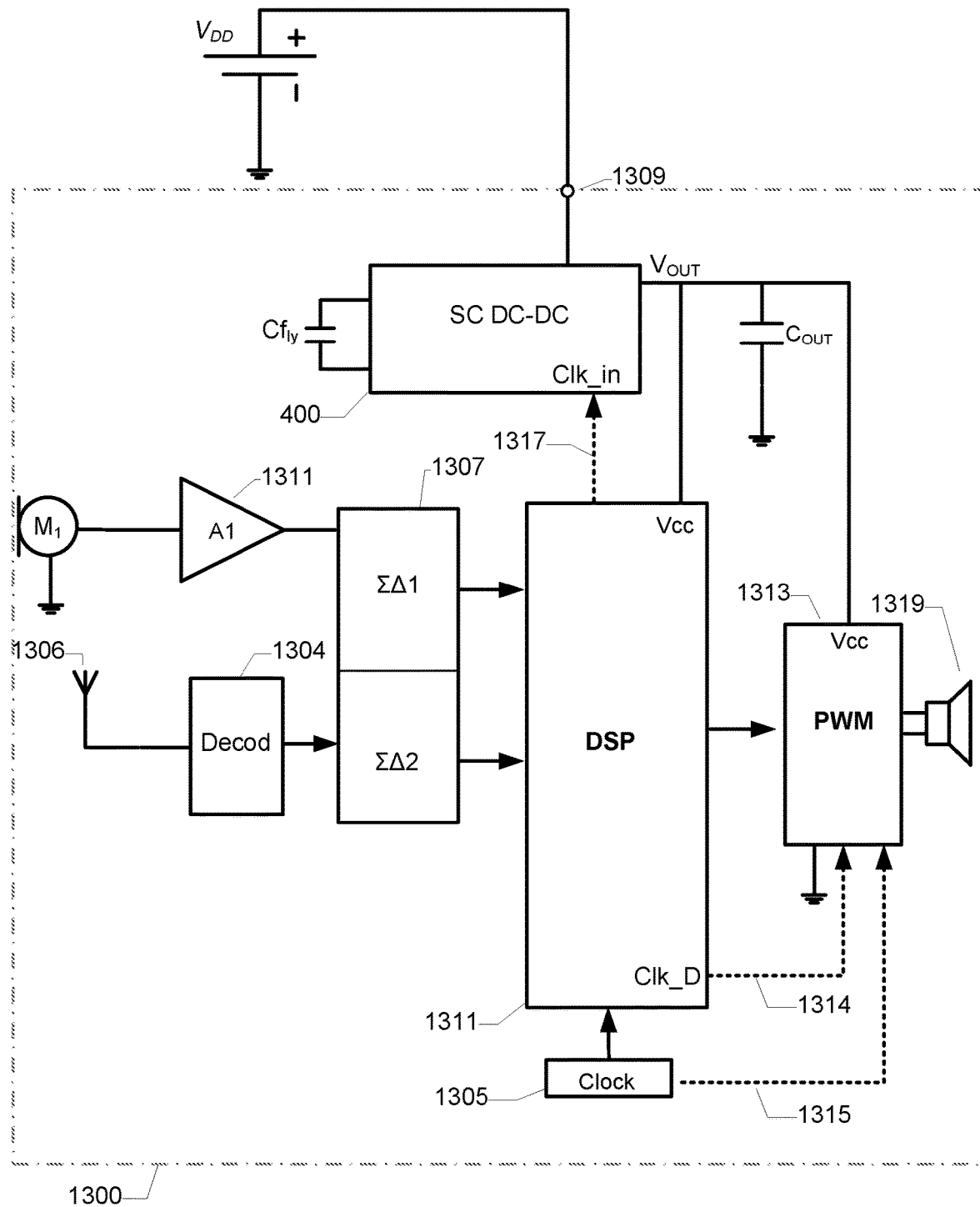
FIG. 1 shows a simplified schematic block diagram of hearing instrument comprising an exemplary switched capacitor DC-DC converter according to any of the below-described embodiments thereof.

In the following, various exemplary embodiments of the present hearing instrument, comprising a switched capacitor DC-DC converter for energy efficient DC voltage conversion, are described with reference to the appended drawings. Various embodiments are described hereinafter with reference to the figures. It should be noted that elements of similar structures or functions are represented by like reference numerals throughout the figures. Like elements or components will therefore not necessarily be described in detail with respect to each figure. The skilled person will further appreciate that certain actions and/or steps may be described or depicted in a particular order of occurrence while those skilled in the art will understand that such specificity with respect to sequence is not actually required. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

FIG. 1 shows a simplified schematic block diagram of an exemplary hearing instrument 1300 comprising a switched capacitor DC-DC converter according to any of the below-described embodiments thereof. The DC input voltage input of the switched capacitor DC-DC converter 400 is connected to a rechargeable battery source $V_{DD}$. The rechargeable battery source is connected to the hearing instrument circuitry 1300, including an integrally formed switched capacitor DC-DC converter 1350, through a positive power supply terminal 1309. The skilled person will understand that the battery source in other embodiments may comprise a non-rechargeable battery source where it is desired to step-up or step-down the nominal DC voltage level supplied by such non-rechargeable battery source to a different DC voltage level more optimal, e.g. lower power consumption, for active circuits or circuit blocks. The hearing instrument 1300 may comprise any type of hearing aid housing style such as Behind-the-Ear (BTE), In-the-Canal (ITC), Completely-in-Canal (CIC), RIC etc.

The rechargeable battery source may comprise at least one Li-Ion battery cell and may hence supply a nominal DC input voltage $V_{DD}$ at around 4.0 V to the switched capacitor DC-DC converter 400. The switched capacitor DC-DC converter 400 is configured to step-down the received DC input voltage with a factor of approximately 2:1 and/or 3:1 to supply a DC output voltage $V_{out}$ of about 1.2 V. An output/smoothing capacitor $C_{out}$ is connected to the DC output voltage $V_{out}$ and at least one flying capacitor $C_{fly}$ is connected to a switch array of the converter as previously discussed. The 1.2 V DC output voltage typically provides optimum or near-optimum power supply conditions for the individual active circuits or circuit blocks of the hearing instrument, in particular for a class D output amplifier 1313, such that the battery life of the hearing instrument is maximized. The optimum supply condition at this 1.2 V battery level is inter alia caused by circuit optimization at the voltage level supplied by traditional non-rechargeable Zinc-air batteries. The DC power supply, at DC supply input $V_{CC}$, of the class D output amplifier 1313 is connected to the DC output voltage $V_{out}$ of the switched capacitor DC-DC converter 400. This connection introduces significant peak power/current delivery demands on the switched capacitor DC-DC converter 400 in hearing instrument context and is therefore likely to induce a relatively large ripple voltage on the DC output voltage $V_{out}$ for that reason. The peak current drawn by the class D output amplifier 1313 from its DC supply rail may exceed 50 mA for certain types of low impedance hearing aid receivers or loudspeakers 1319 of high power hearing instruments. The capacitance of the output/smoothing capacitor $C_{out}$ may be larger than 500 nF such as between 1 and 10 μF while the capacitance of the flying capacitor $C_{fly}$ may lie between 100-500 nF. The output/smoothing capacitor and flying capacitor may be external to an integrated circuit on which the switched capacitor DC-DC converter 400 is integrated together with other active circuit blocks of the hearing instrument. The other active circuits of the hearing instrument may comprise a microphone preamplifier 1311, analog-to-digital converters ΣΔ1-2 1307, clock generator 1305, control and processing circuit 1311, a wireless receiver and decoder 1304 and class D output amplifier 1313. One or more of these active circuits may be connected to the DC output voltage $V_{out}$ for energy supply. The wireless receiver and decoder 1304 is coupled to an RF antenna 1306 for receipt of wireless RF modulated digital audio signals and/or data signals. The skilled person will understand that the wireless receiver and decoder 1304 may be compliant with a Bluetooth standard such as the Bluetooth LE standard.

The hearing instrument 1300 comprises at least one microphone $M_1$ generating an audio signal in response to incoming sound at the hearing instrument. The audio signal is amplified/buffered and digitized in an input channel comprising the microphone preamplifier 1309 and analog-to-digital converter ΣΔ1 to provide a digital microphone signal to an appropriate input port or channel of the control and processing circuit 1311. The control and processing circuit 1311 may comprise a software programmable DSP core and may apply one or more signal processing functions to the digital microphone signal under control of a set of executable program instructions or code. The one or more signal processing functions are preferably adapted to process the digital microphone signal according to a hearing loss of a user of the hearing instrument such that an appropriately compensated microphone signal is supplied to the user or patient via loudspeaker 1319. These signal processing functions may comprise different processing parameters of functions like non-linear amplification, noise reduction, frequency response shaping etc. Hence, various processing parameters of the one or more signal processing functions may have been determined during a preceding hearing aid fitting session with the user at an audiologist office and loaded into a non-volatile data memory space of the DSP. The control and processing circuit 1311 is clocked by a master clock signal supplied by a master/system clock generator 1305 and the clock frequency may lie above 2 MHz for example between 2 and 40 MHz. The master clock generator 1305 may additionally supply synchronous clock signals to the first and a second analog-to-digital converters ΣΔ1, ΣΔ2.

As discussed above, the class D output amplifier 1313 converts the compensated microphone signal into a corresponding modulated output signal at a predetermined modulation frequency which is applied to the miniature receiver or loudspeaker 1319 for production of sound pressure in the hearing instrument user's ear canal. The modulation frequency of the class D output amplifier may vary depending on the type of modulation scheme and performance requirement of the amplifier in a specific application. The class D output amplifier 1313 may be configured to PWM or PDM modulate the output signal to the loudspeaker 1319 with a modulation frequency between 250 kHz and 2 MHz. The modulation frequency of the class D output amplifier may be set by a suitable clock signal 1314 delivered by the control and processing circuit 1311 via a suitable output port or driver 1314 to the class D output amplifier. In alternative embodiments, the clock signal 1315 may be derived directly from the master clock generator 1305. In both cases, the modulation frequency of the class D output amplifier is preferably synchronous to the master clock signal of the master clock generator 1305 and may be a down-divided replica of the master clock signal.

The output voltage regulator of the SC DC-DC converter 400 of the hearing instrument 1300 is preferably configured to select the clock frequency, and hence the first and second clock phases $\phi_1$, $\phi_2$ of the clock signal, of the SC converter 400 from the previously predefined set of fixed clock frequencies in accordance with the modulation frequency of the class D output amplifier 1313. The predefined set of fixed clock frequencies may comprise at least two fixed clock frequencies—for example three, four, five or even more fixed clock frequencies. The individual clock frequencies of the predefined set of fixed clock frequencies may be related by an integer ratio such as 2 or 4. The lowest clock frequency of the predefined set of fixed clock frequencies may lie between 125 kHz and 1 MHz.

This clock control or synchronization scheme between the clock frequency of the SC DC-DC converter 400 and the modulation frequency of class D output amplifier 1313 allows the output voltage regulator 401 to place the voltage ripple components of the SC DC-DC converter 400 at frequency bands or ranges where they create minimal interference with the class D output amplifier 1313 and/or other circuits blocks of the hearing instrument such as the microphone preamplifier 1311, analog-to-digital converters ΣΔ1-2, clock generator 1313, a wireless receiver and decoder 1304 etc. According to one embodiment, each clock frequency of the predefined set of fixed clock frequencies is an integer multiple of the predetermined modulation frequency of the class D output amplifier. This relationship ensures that ripple voltage components appearing on the DC output voltage $V_{out}$ of the SC DC-DC converter 400 are folded back outside the audio spectrum e.g. at zero Hz or DC. This is particularly advantageous for the class D output amplifier 1313 because the latter type of amplification circuit typically possesses a relatively poor power supply rejection ratio (PSRR) and/or is sensitive to power supply noise due to an noise shaping mechanism placing a high level of quantization noise above the audio band in the noise-shaped output signal. The relatively poor power supply rejection ratio (PSRR) of the class D output amplifier is often caused by a direct connection between output stage active switch devices and the positive DC supply rail of the class D amplifier 1313.

According to one such exemplary embodiment of the present hearing instrument, the modulation frequency of class D output amplifier is set to 250 kHz and the predefined set of fixed clock frequencies of the output voltage regulator comprises at least clock frequencies 250 kHz, 500 kHz and 1 MHz.

According one embodiment of the present hearing instrument the clock frequencies of the predefined set of fixed clock frequencies of the SC DC-DC converter 400 and the predetermined modulation frequency of the class D output amplifier are synchronous. This feature is particularly advantageous to maintain a well-defined relationship between the switching frequencies of the SC DC-DC converter 400 and the modulation frequency of class D output amplifier 1313 despite temperature variations and component drift etc. The skilled person will understand that the synchronous operation of the SC DC-DC converter 400 and the class D output amplifier may be achieved by configuring or adapting the clock generator of the output voltage regulator 401 (refer to FIG. 4) to accept an external clock signal 1317 from the master clock generator 1305 of the hearing instrument. This external clock signal 1317 may be generated and supplied by the control and processing circuit 1311 via a suitable output port or may be derived directly from the master clock generator 1305.

Figure 2A:
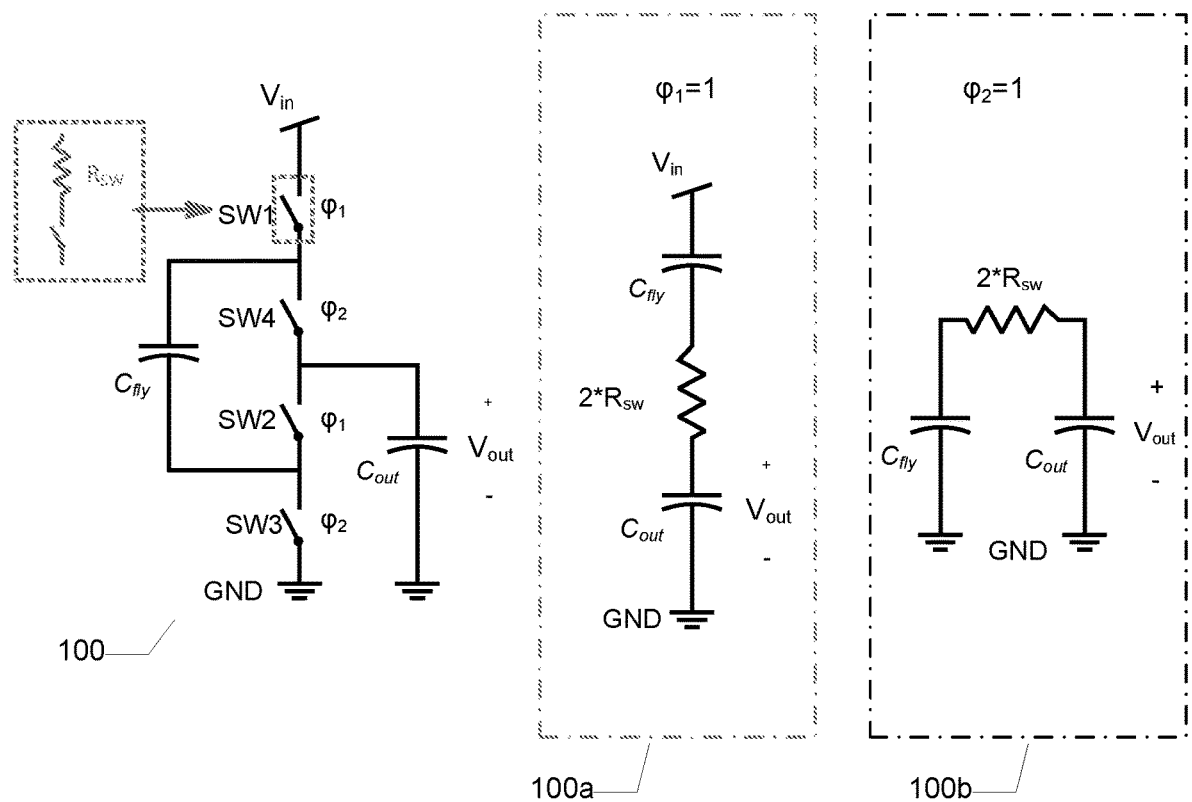
FIG. 2A) is a simplified schematic block diagram of a first exemplary charge pump circuit for a switched capacitor DC-DC converter in accordance with a first embodiment, FIG. 2B) is a simplified schematic block diagram of a second exemplary charge pump circuit for a switched capacitor DC-DC converter in accordance with a second embodiment, FIG. 3A) shows a generally applicable electrical model of a switched capacitor DC-DC converter, FIG. 3B) shows a model of the loss resistance $R_{eq}$ of a second exemplary charge pump circuit comprising a plurality of multi-segmented semiconductor switches.

FIG. 2A) is a simplified schematic block diagram of a first exemplary charge pump circuit 100 for a switched capacitor DC-DC converter in accordance with a first embodiment. The switched capacitor DC-DC converter is a step-down topology configured for converting a DC input voltage into a DC output voltage of approximately one-half of the DC input voltage. The charge pump circuit 100 comprises a flying capacitor $C_{fly}$, an output/smoothing capacitor $C_{out}$ and a switch array including a first controllable semiconductor switch SW1, a second controllable semiconductor switch SW2, a third controllable semiconductor switch SW3 and a fourth controllable semiconductor switch SW4. Switches SW1 and SW2 are driven by a first clock phase $\phi_1$ of a clock signal and switches SW3 and SW4 are driven by a second clock phase $\phi_2$ of the clock signal as schematically illustrated on the drawing. The first and second clock phases $\phi_1$, $\phi_2$ of the clock signal are complementary and non-overlapping. The DC input voltage $V_{in}$ for the charge pump circuit 100 is applied to switch SW1 and the DC output voltage $V_{out}$ is delivered at output/smoothing capacitor $C_{out}$. A load of the charge pump circuit 100 is connected across the output/smoothing capacitor $C_{out}$ and the skilled person will understand the latter supplies energy power to the load when the flying capacitor $C_{fly}$ is charging from the DC input voltage.

The skilled person will appreciate that each of the controllable semiconductor switches SW1, SW2, SW3 and SW4 may comprise a MOSFET, e.g. NMOS transistor, or a combination of MOSFETs, as the small size, large off-resistance and low on-resistance of MOSFET switches are advantageous properties in numerous applications of the charge pump circuit 100.

In the present step-down topology of the charge pump circuit 100, SW1 is connected between the DC input voltage and a positive terminal of the flying capacitor; SW2 is connected between a negative terminal of the flying capacitor and and the DC output voltage. In an alternative 2:1 step-up embodiment, SW2 is connected between the negative terminal of the flying capacitor and a negative DC supply rail, such as GND. SW3 is connected between the negative terminal of the flying capacitor and the negative DC supply rail—e.g. GND. In the alternative 1:2 step-up embodiment, SW3 is connected between the negative terminal of the flying capacitor and the DC input voltage. SW4 is connected between the positive terminal of the flying capacitor and the DC output voltage.

During operation of the charge pump circuit 100, the first and second switches SW1, SW2 are switched between respective on-states and off-states in accordance with the first clock phase $\phi_1$ and the third and fourth switches SW3, SW4 are switched between respective on-states and off-states in accordance with the second clock phase $\phi_2$. Hence, the switch array is configured to, in or during the first clock phase, charge the flying capacitor $C_{fly}$ from the DC input voltage $V_{in}$ through the on-resistances of SW1 and SW2. The combined on-resistance of SW1 and SW2 is schematically represented by resistor $2*R_{SW}$.

Furthermore, during the first clock phase, the switches SW3 and SW4 are off or non-conducting which lead to the equivalent schematic circuit diagram 100a. As illustrated, the flying capacitor $C_{fly}$ and output capacitor $C_{out}$ are effectively connected in series between the DC input voltage $V_{in}$ and GND such that the output voltage is charged to approximately one-half of the DC input voltage by periodically switching between the first and second clock phases in steady state operation when no load current is drawn from the output voltage of the charge pump circuit 100. The switch array is configured to, in or during the second clock phase $\phi_2$, discharge the flying capacitor $C_{fly}$ into the output capacitor $C_{out}$ through a charge sharing mechanism due to the parallel connection of the flying capacitor and output capacitor through the conducting states of the switches SW3 and SW4. During the second clock phase, the switches SW1 and SW2 are off, i.e. or non-conducting, which leads to the equivalent schematic circuit diagram 100b. As illustrated, the flying capacitor $C_{fly}$ and output capacitor $C_{out}$ are effectively connected in parallel and disconnected from the DC input voltage $V_{in}$.

The skilled person will appreciate that each of the controllable semiconductor switches SW1, SW2, SW3 and SW4 may comprises a control terminal (not shown), e.g. a gate terminal for MOSFETs, to which the first or second clock phases $\phi_1$, $\phi_2$ are applied to selectively switch the controllable semiconductor switch in question between its on-state and off-state.

Figure 2B:
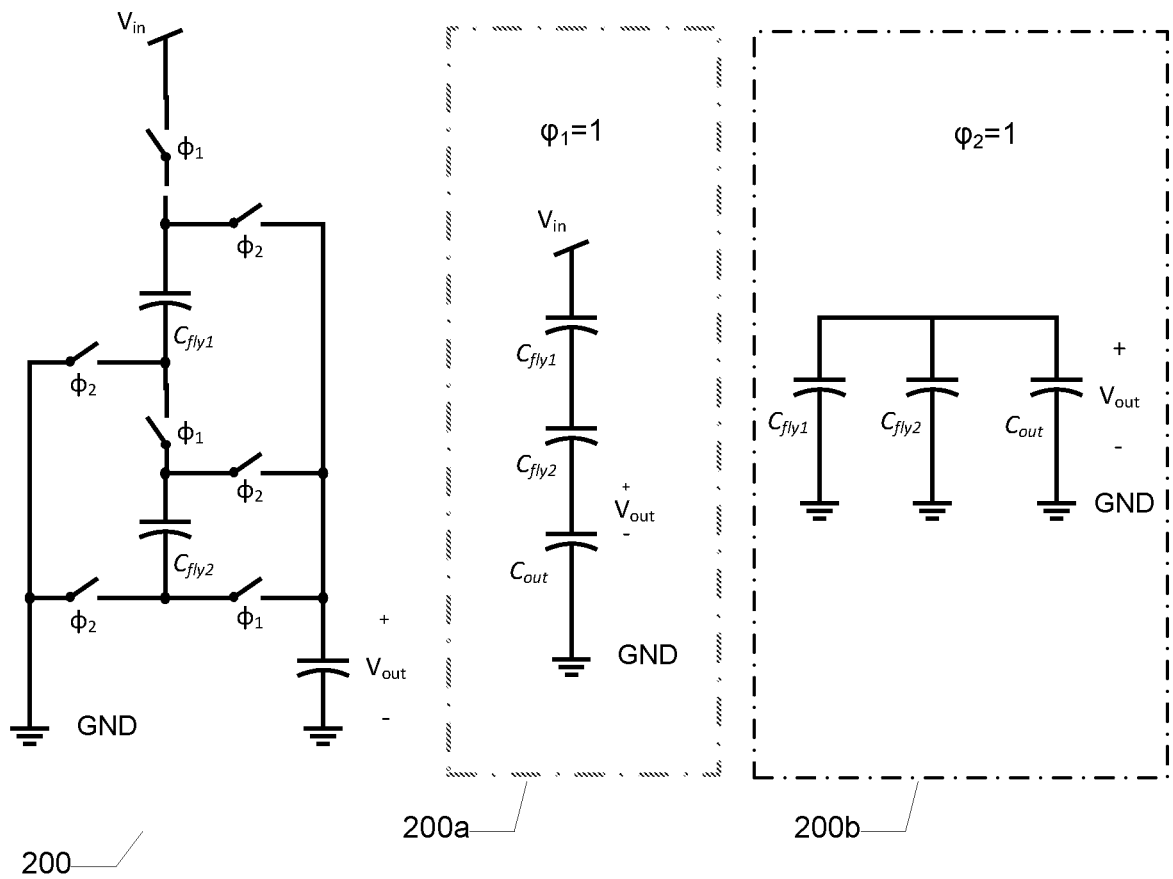

FIG. 2B) is a simplified schematic block diagram of a second exemplary charge pump circuit 200 for a switched capacitor DC-DC converter in accordance with a second embodiment. The present embodiment of the switched capacitor DC-DC converter possesses a 3:1 step-down topology configured for converting the DC input voltage $V_{in}$ into a DC output voltage $V_{out}$ of approximately one-third of the DC input voltage. The present charge pump circuit 200 comprises, in contrast to the previously discussed pump circuit 100, two separate flying capacitors—a first flying capacitor $C_{fly1}$ and a second flying capacitor $C_{fly2}$. The charge pump circuit 200 comprises additionally an output/smoothing capacitor $C_{out}$ and a switch array including a total of seven controllable semiconductor switches controlled by respective clock phases of the first and second non-overlapping clock phases $\phi_1$, $\phi_2$ as illustrated.

During operation of the charge pump circuit 200, the switch array is configured to, in or during the first clock phase, simultaneously charge the first flying capacitor $C_{fly1}$ and second flying capacitor $C_{fly2}$ from the DC input voltage through the on-resistances of active switches. Furthermore, during the first clock phase, the switches operated by the second clock phase $\phi_2$ are off or non-conducting which leads to the equivalent schematic circuit diagram 200a. As illustrated, the first and second flying capacitors and the output capacitor $C_{out}$ are effectively connected in series between the DC input voltage $V_{in}$ and GND, or another negative supply rail, such that the output voltage is charged to approximately one-third of the DC input voltage in steady state operation of the pump circuit for the reasons discussed above in connection with the first charge pump circuit 100. The switch array is configured to, during the second clock phase $\phi_2$, discharge the first and second flying capacitors into the output capacitor $C_{out}$ through a charge sharing mechanism caused by the parallel connection of the first and second flying capacitors and output capacitor through the respective on-resistances of the active/conducting switches. During the second clock phase, the switches operated by the first clock phase $\phi_1$ are off or non-conducting while the switches operated by the second clock phase $\phi_2$ are on or conducting which lead to the equivalent schematic circuit diagram 200b of the charge pump circuit 200. As illustrated, the first and second flying capacitors $C_{fly1}$ and $C_{fly2}$ and the output capacitor $C_{out}$ are effectively connected in parallel and disconnected from the DC input voltage $V_{in}$.

Figure 3A:
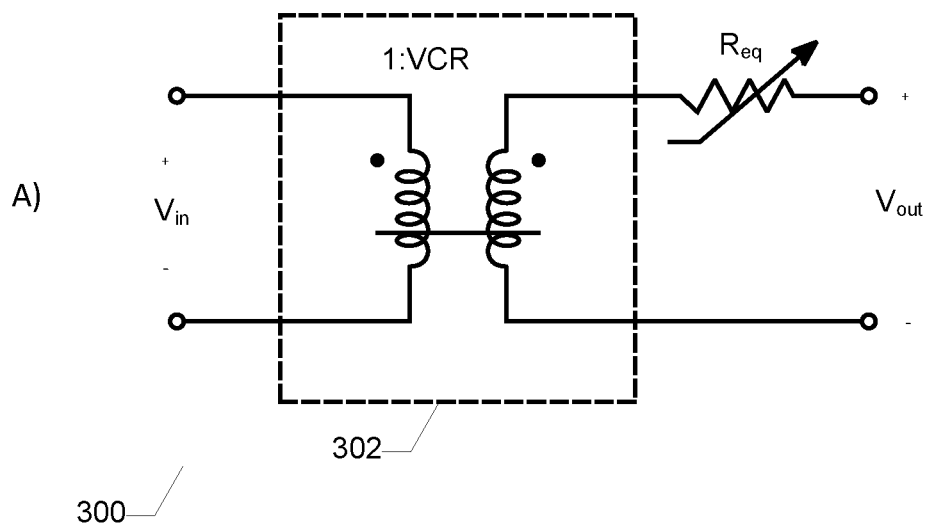

FIG. 3A) is a generally applicable model 400 of a switched capacitor DC-DC converter which model is discussed below to highlight some of the properties of the switched capacitor DC-DC converter in accordance with one or more embodiments. The DC input voltage $V_{in}$ feeds input power or energy to switched capacitor DC-DC converter and during operation the latter generates the DC output voltage $V_{out}$ which may be higher or lower than the DC input voltage depending on the topology of the switched capacitor DC-DC converter as discussed above. The switched capacitor DC-DC converter is particularly efficient when the nominal DC input voltage and DC output voltage are related by an certain ratio, illustrated by VCR, such as ⅓ or ½ or ⅔ or 2, or 3 or 5 etc. Hence, the model 400 of the switched capacitor DC-DC converter comprises an ideal transformer 402 with a variable winding ratio as set by the VCR and an equivalent loss resistance $R_{eq}$ connected in series with a secondary winding of the transformer 302.

The loss resistance $R_{eq}$ comprises two separate resistance components:
1) a first resistance component representing an equivalent output resistance associated with switching of the one or more flying capacitors at the clock frequency of the clock signal driving the first and second clock phases. The skilled person will understand that this equivalent output resistance is inversely proportional to the clock frequency such that increasing clock frequency leads to decreasing equivalent output resistance; and
2) a second resistance component representing the combined on-resistance of the active semiconductor switches in any particular clock phase, e.g. on-resistances of the switches SW1 and SW2 in the first clock phase $\phi_1$ of the previously discussed exemplary 2:1 step-down charge pump circuit 100.

The latter resistance component 2) is mainly determined by the size of the semiconductor switch in question, the semiconductor process technology and level of the applied control voltage. However, in certain embodiments, each, or at least a subset, of the controllable semiconductor switches of the switch matrix of the charge pump circuit is formed by a plurality of individually controllable switch segments such that a suitable control device and mechanism may activate merely a subset of the plurality of individually controllable switch segments during activation/turn-on of the corresponding semiconductor switch. This use of segmented semiconductor switches provides a controllable on-resistance or equivalently controllable conductance of the semiconductor switch as discussed in additional detail below.

Figure 3B:
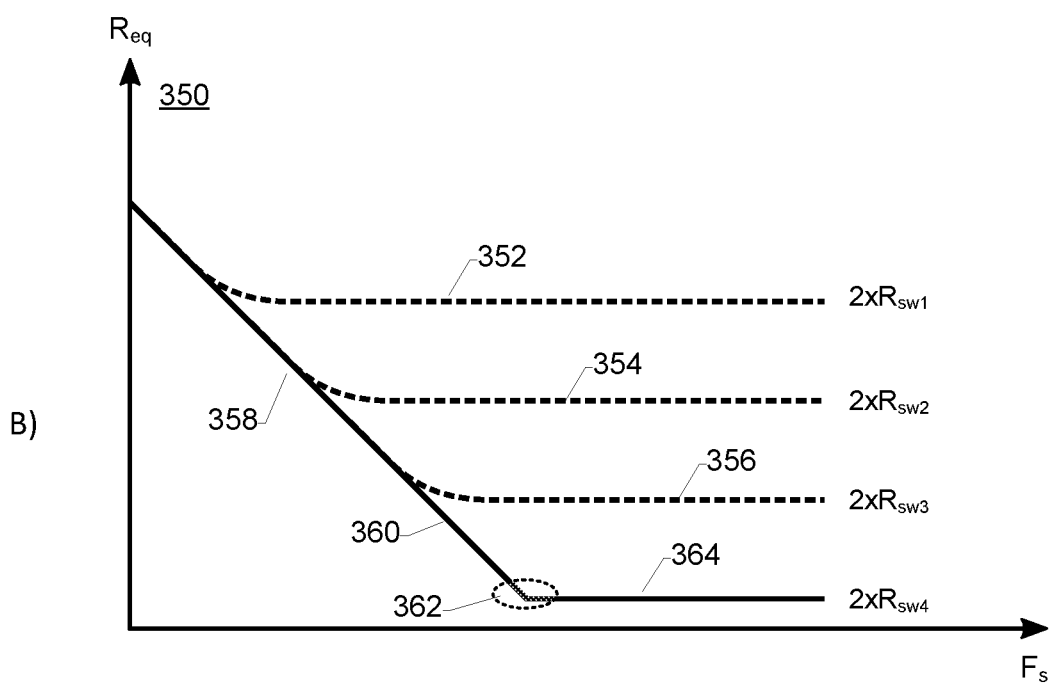

Graph 350 of FIG. 3B) illustrates how the loss resistance $R_{eq}$ of a multi-segmented semiconductor switch comprises two separate resistance components that are individually controllable. The y-axis shows the loss resistance $R_{eq}$ on an arbitrary logarithmic scale and the x-axis depicts the clock frequency $F_s$ of the clock signal on a logarithmic scale. The clock frequency $F_s$ is equal to a switching frequency of the flying capacitor as set by the first and second clock phases. The loss resistance $R_{eq}$ plots 352, 354, 356, 358 of graph 350 illustrate a particular segmented switch embodiment where each of the controllable semiconductor switches of the switch matrix comprises eight identical individually controllable switch segments connected in parallel. However, other segmented switch embodiments may use fewer or more parallelly connected individually controllable switch segments in each of the controllable semiconductor switches such as between 2 and 16 parallelly connected switch segments.

Hence, the on-resistance, and the equivalent conductance, of a particular controllable semiconductor switch in the present embodiment can be controlled in eight steps by activating from one to eight switch segments via an appropriate set of switch segment control signals applied to the respective controls terminals, e.g. gate terminals, of the switch segments. Plot 358 shows schematically by depicting merely asymptotic approximations the loss resistance $R_{eq}$ versus clock frequency $F_s$ when all eight switch segments are activated in the on-state or conducting state of the semiconductor switch in question. The asymptotic plot 358 comprises two essentially straight portions where the first plot portion 360 shows the loss resistance $R_{eq}$ where the latter is dominated by the first resistance component representing the equivalent output resistance associated with the flying capacitor switching. As expected, the loss resistance $R_{eq}$ is inversely proportional to the clock frequency $F_s$ in the first plot portion 360. The second plot portion 364 shows the loss resistance $R_{eq}$ where the latter is dominated by the second resistance component representing the combined on-resistance of the eight parallel switch segments of the semiconductor switch. As expected, the loss resistance $R_{eq}$ is substantially constant independent of the clock frequency $F_s$ in the second plot portion 364 because of the series connection of the first and second resistance components and the diminishing resistance of the first resistance component. Finally, the knee-point 362 shows the clock frequency $F_s$ where the first and second resistance components of loss resistance $R_{eq}$ are essentially equal.

The plots 356, 354, 352 illustrate schematically the effect of a decreasing number of active switch segments of the semiconductor switch—from eight in plot 358 and down to 4, 2 and 1 active switch segment(s), respectively. As expected, the loss resistance $R_{eq}$ of the semiconductor switch increases progressively with a decreasing number of active switch segments at higher clock or switching frequencies $F_s$ because of the dominating influence of the second resistance component of the loss resistance $R_{eq}$. Furthermore, the loss resistance $R_{eq}$ of the semiconductor switch remains largely independent of the number of active switch segments at very small clock or switching frequencies $F_s$ because of the now dominating influence of the first resistance component of the loss resistance $R_{eq}$.

Figure 4:
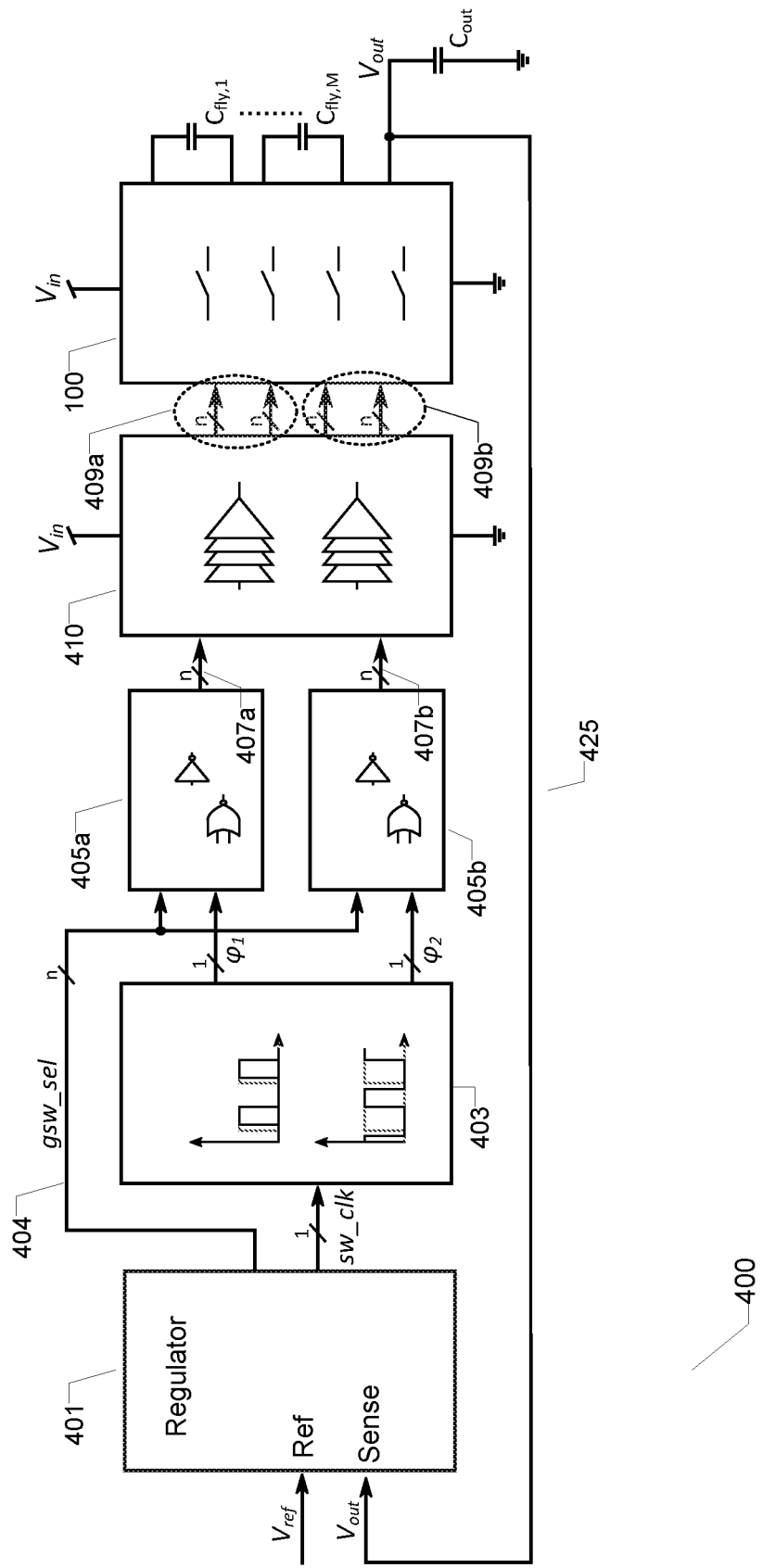
FIG. 4 is a simplified schematic block diagram of an exemplary switched capacitor (SC) DC-DC converter in accordance with a various embodiments.

FIG. 4 is a simplified schematic block diagram of a switched capacitor (SC) DC-DC converter 400 in accordance with a various exemplary embodiments. The SC DC-DC converter 400 may for example be configured to convert the DC input voltage $V_{in}$ into a DC output voltage $V_{out}$ of approximately one-half of the DC input voltage, i.e. 2:1 step-down, by using merely a single one of the illustrated flying capacitors. Other embodiments of the switched capacitor (SC) DC-DC converter 400 may be configured to step-up or boost the input voltage $V_{in}$ into a higher DC output voltage $V_{out}$ for example step-up of 1:2 or 1:3 by appropriate adaption of the topology of the charge pump circuit 100 as discussed above. The skilled person will understand that the DC supply voltage to the charge pump circuit 100, and possibly for a gate driver 410, in the latter embodiments may be derived from the higher DC output voltage $V_{out}$ to provide adequately large voltage for the control terminals of the controllable semiconductor switches.

The DC input voltage $V_{in}$ for the present SC DC-DC converter 400 may be supplied by a rechargeable battery source delivering a nominal DC voltage significantly higher than a desired or optimum voltage for the load circuitry to be energized by the DC output voltage of the SC DC-DC converter 400. The rechargeable battery source may for example comprise one or more Li-Ion battery cells that each may exhibit a nominal output voltage of about 3.7 V. If the SC DC-DC converter 100 is integrated in a hearing instrument, it may be desirable to step-down this nominal Li-Ion battery voltage to a DC voltage close to the typical 1.2 V DC level supplied by conventional non-rechargeable Zinc-air hearing aid batteries. Consequently, a DC reference voltage $V_{ref}$ applied at a Ref input of an output voltage regulator or controller 401 may be set to 1.2 V in the latter embodiment of the SC DC-DC converter 400.

The skilled person will appreciate that the drawing shows merely four separate first and second complementary and non-overlapping clock phases inputted to the charge pump circuit 100. The use of four separate first and second complementary and non-overlapping clock phases is suitable configuration to drive four segmented controllable semiconductor switches SW1, SW2, SW3 and SW4 of the 2:1 step-down SC converter discussed above with reference to FIG. 1. However, alternative embodiments may comprise additional clock phase signals to drive additional controllable semiconductor switches as indicated previously in connection with the description of the charge pump circuit 200. In both cases the four, seven or even further controllable semiconductor switches form a switch array which is driven by the first and second non-overlapping clock phases such that the switch array in the first clock phase, charges at least the first flying capacitor $C_{fly1}$ from the DC input voltage and discharges the first flying capacitor into the output capacitor $C_{out}$ during the second clock phase. The skilled person will additionally understand that appreciate that some embodiments of the charge pump circuit 100 may comprise a so-called "gearbox" combining two or more different converter topologies in combination with a topology switching scheme. One such multi-topology embodiment of the charge pump circuit 100 may comprise a 2:1 step-down SC converter and a 3:1 step-down SC converter where the digital switch array controller is configured to select between the 2:1 step-down SC converter and 3:1 step-down SC converter depending on a voltage difference between the DC input voltage $V_{in}$ and the DC output voltage $V_{out}$. This feature may be advantageous to optimize the power conversion efficiency of the charge pump circuit 100 at varying levels of the DC input voltage $V_{in}$—for example caused by different charging states of the previously discussed rechargeable battery source supplying the DC input voltage to the SC DC-DC converter 400.

The SC DC-DC converter 400 comprises the output voltage regulator 401. The output voltage regulator 401 determines the clock frequency of the charge pump circuit 100 since the first and second non-overlapping clock phases $\phi_1$, $\phi_2$ are derived from the clock signal sw_clk generated by the output voltage regulator 401 via a digital switch array controller as discussed below. The output voltage regulator 401 may comprise a clock generator which is configured for generating the clock signal at a fixed clock frequency or at an adjustable clock frequency. The frequency of the clock signal is adjustable or programmable in the present embodiment but alternative embodiments may use a single fixed clock frequency of the clock signal. In the present embodiment, the frequency of the clock signal is utilized to provide regulation of the DC output voltage via a feedback loop extending from the DC output voltage and back to a first input, Sense, of the output voltage regulator 401 via the feedback wire or conductor 425. The output voltage regulator 401 additionally comprises a DC reference voltage input, Ref, for receipt of a DC reference voltage $V_{ref}$ indicating the desired or target DC output voltage. The feedback loop is operable to minimize a voltage difference or deviation between the DC reference voltage $V_{ref}$ at Ref input and the actual the DC output voltage by adjusting the clock frequency or switching frequency applied to the charge pump circuit 100, via the first and second non-overlapping clock phases $\phi_1$, $\phi_2$ and/or by adjusting an electrical conductance $G_{SW}$ of the controllable semiconductor switches of the charge pump circuit as discussed in additional detail below. In the present embodiment, the output voltage regulator 401 is configured to select a current clock frequency from a predefined set of fixed clock frequencies while alternative embodiments may adjust the clock frequency in accordance with other frequency control schemes. This use of a predefined set of fixed clock frequencies allows for frequency planning in the design phase of the output voltage regulator 401 such that the predefined set of fixed clock frequencies may be selected to minimize electromagnetic interference with certain circuits and components of a particular target application such as a hearing instrument as discussed in additional detail below. The individual clock frequencies of the predefined set of fixed clock frequencies may be related by integer ratios such as 2, 4, 8 etc., e.g. 500 kHz, 1 MHz, 2 MHz and 4 MHz.

The digital switch array controller may comprise combinational and sequential digital logic, e.g. implemented as a digital state machine, configured to generate the respective sets of control signals for driving the respective switch segments of the four segmented controllable semiconductor switches SW1, SW2, SW3 and SW4. The digital switch array controller comprises a non-overlapping clock generator 403 configured to derive the previously discussed first and second non-overlapping clock phases $\phi_1$, $\phi_2$ from the clock signal sw_clk supplied by the output voltage regulator 401. A first switch encoder 405a of the digital switch array controller utilizes the first clock phase $\phi_1$ and a switch select data supplied via a select bus 404 to generate a first set of switch segment control signals on data bus 407a and likewise utilizes the second clock phase $\phi_2$ and the switch segment select bus 404 to generate a second set of non-overlapping switch segment control signals on data bus 407b. The digital switch array controller comprises a gate driver block 410 illustrated as a separate circuit for convenience. The gate driver block 410 is configured to generate the required n switch segment control signals 409a for respective ones of the individually controllable switch segments of each of the first and second controllable semiconductor switches SW1, SW2 in accordance with the first clock phase $\phi_1$ and likewise generating the n switch segment control signals 409b for respective ones of the individually controllable switch segments of each of the third and fourth controllable semiconductor switches SW3, SW4 in accordance with the second clock phase $\phi_2$. The gate driver block 410 may for example comprise a plurality of digital buffers, a plurality of level shifters or voltage translators for supplying sufficient drive voltage and current to drive the loads presented by the respective control inputs of the individually controllable switch segments.

The SC DC-DC converter 400 may include different embodiments of the output voltage regulator 401 providing different switching schemes for unsegmented or segmented versions of the controllable semiconductor switches of the charge pump circuits 100, 200.

Figure 9A:
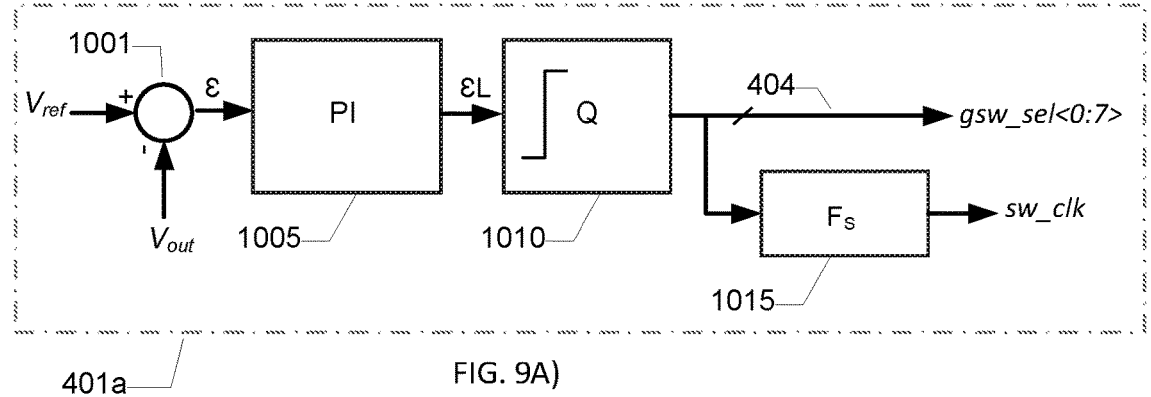
FIG. 9C) shows a simplified block diagram of the third output voltage regulator embodiment of the exemplary SC DC-DC converter.

A simplified block diagram of a first embodiment of the output voltage regulator 401a is illustrated on FIG. 9A). The output voltage regulator 401a comprises an error signal generator 1001, e.g. a subtraction circuit, configured to subtract the DC reference voltage $V_{ref}$ indicating the desired or target DC output voltage of the SC DC-DC converter 400 and the feedback voltage $V_{out}$ to determine a control signal or error signal $\varepsilon$. The error signal $\varepsilon$ is applied to the input of a loop filter 1005 which integrates or lowpass filters the error signal to generate a lowpass filtered control signal $\varepsilon L$. The lowpass filtered control signal $\varepsilon L$ is thereafter applied to the input of a multi-level quantizer 1010, i.e. A/D converter, configured to convert the lowpass filtered control signal $\varepsilon L$ into a corresponding digital control signal at a predetermined sampling frequency. The resolution of the multi-level quantizer 1010 may be relatively small for example between 2 bits and 4 bits corresponding to 4 quantization levels and 16 quantization levels, respectively. Hence, the digital control signal may be representing the current or instantaneous amplitude of the lowpass filtered control signal $\varepsilon L$ by between 4 and 16 amplitude levels. The predetermined sampling frequency of a multi-level quantizer 1010 may vary between different embodiments of the SC converter and may depend on various design parameters such as the selected clock frequency or clock frequency range and a corner frequency/time constant of a lowpass/integrator response of the loop filter 1005 as discussed in additional detail below. The predetermined sampling frequency of the multi-level quantizer 1010 may lie between 500 kHz and 4 MHz. In some embodiments, the predetermined sampling frequency of the multi-level quantizer 1010 may be set at two times the maximum clock or switching frequency $F_s$ of the charge pump circuit. The charge pump circuit transfers charge to the output capacitor $C_{out}$ on both rising and falling edges of the clock signal which means that voltage ripple on the DC output voltage comprises frequency components located at two times the maximum switching frequency $F_s$. In certain advantageous embodiments of the multi-level quantizer, e.g. 1010, 1110, 1210, the latter may be sampled synchronously to, or in-phase with, the switching frequency $F_s$ to eliminate aliasing products.

The loop filter 1005 may comprise a so-called PI (proportional-integral) type of filter circuit or filter function comprising a low-frequency gain towards DC, a lowpass pole at a first corner frequency and a zero at a second corner frequency. The first corner frequency caused by the lowpass pole is preferably arranged below 100 Hz, or below 50 Hz or below 10 Hz such that a low-frequency response of the loop filter 1005 resembles an integrator response. With the lowpass pole at 50 Hz, the low-frequency gain may be set to about 70 dB. The second corner frequency is preferably significantly higher than the first corner frequency for example at least 20 times higher such as more than 100 times higher. The second corner frequency may be located above the audio bandwidth—for example above 20 kHz.

It is generally desirable to configure or design the loop filters 1005, 1105, 1205 with a relatively high gain at DC to ensure the DC output voltage has a small DC voltage error i.e. closely tracks the DC reference voltage. For audio applications of the SC DC-DC converter 400, the gain of the loop filter at low audio frequencies for example below 1 kHz may be set to a relatively large value, e.g. at least 40 dB, because loudspeaker drivers, e.g. class D output amplifiers, connected to the DC output voltage tend to draw large currents at low frequencies where the electrical impedance of the loudspeaker typically is small.

The lowpass characteristics of the loop filters 1005, 1105, 1205 according to any of the embodiments discussed above ensures that the SC DC-DC converter 400 often is operating around a single quantization level of the multi-level quantizer 1010, 1110, 1210. Hence, variations of the lowpass filtered control signal $\varepsilon L$ between two consecutive sampling points or instances of the multi-level quantizer will not exceed a single quantization level. This means that the multi-level quantizer 1010 may be configured to sample markedly less quantization levels at each sampling instant than the number of discrete quantization levels of the multi-level quantizer. For example, while the present multi-level quantizer may comprise between 8 and 16 quantization levels merely two of these need to be sampled. This will reduce the overall power consumption of the multi-level quantizer 1010 by a factor of four or even eight.

The skilled person will understand the selection of the first corner frequency and the second corner frequency depend on parameter values of other fixed or variable components of the previously discussed feedback loop of the SC DC-DC converter 400 extending from the DC output voltage and back to the sense input of the output voltage regulator 401. These other fixed or variable components of the DC-DC converter comprise inter alia the variable loss resistance $R_{eq}$, the capacitance of the output capacitor $C_{out}$, the load current, the clock frequency $F_s$ of the clock signal sw_clk and a step size of the quantization levels. The frequency response of loop filter 1105, including its asymptotic DC gain and asymptotic high-frequency gain, are designed to ensure stability of the feedback loop even at worst parameter values of the above-discussed fixed or variable components of the DC-DC converter.

According to one 2:1 step-down embodiment of the SC DC-DC converter 400, designed for hearing instrument applications powered by a rechargeable Li-Ion battery, the following exemplary design parameters are utilized:

load current at $V_{out}$ lies between 1 mA and 10 mA,
a nominal DC input voltage about 4.2 V,
a DC output voltage of 1.8 V,
an output capacitance $C_{out}$=4 µF, $F_s$=250 kHz–1 MHz, Lowpass pole of loop filter at 53 Hz,
second corner frequency at 27 kHz,
DC gain of loop filter 69 dB,
high frequency gain of the loop filter 16 dB.

The loop filter 1105 may comprise an analog filter or a discrete time filter—for example a fixed switched capacitor PI filter or a programmable switched capacitor PI filter where certain filter characteristics such as the first corner frequency and/or the second corner frequency may be programmable and controlled by the voltage regulator circuit. The skilled person will understand that the loop filter 1105 and the error signal generator 1001 may be integrally formed for example as a differential input switched capacitor PI filter.

The digital signal supplied at the output of multi-level quantizer 1010 may be directly encoded on the previously discussed switch segment select bus 404 (gsw_sel<0:7>) such that the binary code on the switch segment select bus 404 directly reflects the amplitude or level of the lowpass filtered control signal εL. This encoding principle is often referred to as "thermometer coding".

In the illustrated embodiment each of the first, second, third and fourth controllable semiconductor switches SW1, SW2, SW3 and SW4 of the charge pump circuit 100 comprises eight individually controllable switch segments driven by respective sets of switch segment control signals. The skilled person will understand that each, or at least one, of the first, second, third and fourth controllable semiconductor switches SW1, SW2, SW3 and SW4 may comprise less than eight individually controllable switch segments or more than eight individually controllable switch segments, e.g. between 2 and 16 individually controllable switch segments to keep a reasonable circuit complexity. The on-resistance of the plurality of individually controllable switch segments may be substantially identical or different. The plurality of individually controllable switch segments may be coupled in parallel between input and output terminals of each of the controllable semiconductor switches. The first and second sets of switch segment control signals applied to the respective switch segments of SW1 and SW2 are derived from the first clock phase by the previously discussed digital switch array controller. The third and fourth sets of switch segment control signals applied to the respective switch segments of SW3 and SW4 are derived from the second clock phase by the previously discussed digital switch array controller. This arrangement allows the voltage regulator 401a to provide a variable or adaptive conductance of each of the semiconductor switches SW1, SW2, SW3 and SW4 during converter operation by selecting varying subsets of the eight individually controllable switch segments for each semiconductor switch in accordance with the amplitude of the digital control signal. The same subset of switch segments is preferably utilized for each of the semiconductor switches SW1, SW2, SW3 and SW4 for a particular level or amplitude of the digital control signal to simply layout and encoding of the switch control scheme/mechanism of the digital switch array controller.

Hence, at the maximum level of the digital control signal the binary value eight on the switch segment select bus 404 (gsw_sel<0:7>) may be coded as "11111111" and this value will turn-on all eight individually controllable switch segments of each of the semiconductor switches and provide a maximum conductance, i.e. minimum resistance, of each of the semiconductor switches SW1, SW2, SW3 and SW4 in its on-state. Smaller levels of the digital control signal such as two generates a correspondingly smaller binary value on the switch segment select bus 404 e.g. "00000011" due to the thermometer encoding. This amplitude level will cause the voltage regulator 401a to turn-on or activate only two segments of the eight individually controllable switch segments of each of the semiconductor switches leading to a four times smaller conductance of each controllable semiconductor switch compared to the maximum conductance discussed above. Hence, the present embodiment of the output voltage regulator 401a may select a switch conductance value, $G_{SW}$, of each of the first, second, third and fourth controllable semiconductor switches from a set of eight switch conductance values. Consequently, some embodiments of the voltage regulator 401a may be configured to select the respective segment subsets such that the conductance of each of the semiconductor switches SW1, SW2, SW3 and SW4, in its on-state, tracks the amplitude of the digital control signal. The conductance of each of the semiconductor switches SW1, SW2, SW3 and SW4 may be increasing with increasing amplitude of the digital control signal and vice versa since a large amplitude of the digital control signal indicates a large difference between the target or desired DC output voltage $V_{out}$ of the switched capacitor DC-DC converter and the DC reference voltage $V_{ref}$.

The skilled person will understand that by segmenting each, or at least one, of the semiconductor switches of the charge pump circuit, the electrical conductance of the semiconductor switch or switches can be controlled and exploited by the voltage regulator to control or adjust the DC output voltage $V_{out}$ of the switched capacitor DC-DC converter. The output voltage adjustment can be understood by considering the variable loss resistance $R_{eq}$ of the switched capacitor DC-DC converter provided by the adjustable conductance of the semiconductor switches as discussed above. A valuable benefit of segmented semiconductor switches in the charge pump circuit is that only a small fraction, i.e. merely a subset of the plurality of individually controllable switch segments of each of the semiconductor switches need to be activated at small loads. This feature reduces the switching losses incurred by switching on and off the controllable semiconductor switches under such light load conditions and reduces peak currents in the controllable semiconductor switches.

FIG. 9A) illustrates schematically the output voltage regulator 401a which in addition to the previously discussed circuit blocks comprises a clock frequency selector 1015 which selects the frequency of the clock signal sw_clk generated by the output voltage regulator 401a as discussed above. The output voltage regulator preferably comprises an adjustable clock generator (not shown) configured to generate a predefined set of fixed clock frequencies such as between more than two, three or four fixed clock frequencies for example between two and eight fixed clock frequencies. The output voltage regulator is configured to switch between these individual clock frequencies of the predefined set of fixed clock frequencies in accordance with the level or amplitude of the digital control signal to provide an additional, or even alternative, control mechanism for adjusting the DC output voltage $V_{out}$ of the switched capacitor DC-DC converter. This output voltage adjustment mechanism can be understood by considering the variance of the first resistance component, of the loss resistance $R_{eq}$ of the switched capacitor DC-DC converter, representing the equivalent output resistance associated with the switching of the one or more flying capacitors.

The provision of the predefined set of fixed clock frequencies enable system level frequency planning where the present switched capacitor DC-DC converter only generates noise disturbances at frequencies where the remaining portion of the system is insensitive to noise or at least has reduced sensitivity to noise. The reference to system level means the complete portable communication device, such as a hearing instrument, in which the present switched capacitor DC-DC converter is to be exploited for DC power supply purposes as discussed in additional detail below. The individual clock frequencies of the predefined set of fixed clock frequencies are preferably related by an integer factor for example 2, 3, 4 or 8. In this manner, the ripple noise components on the DC output voltage and emitted electromagnetic noise components are located at known and well-defined regions of the frequency spectrum despite the switching between these individual clock frequencies.

Figure 5:
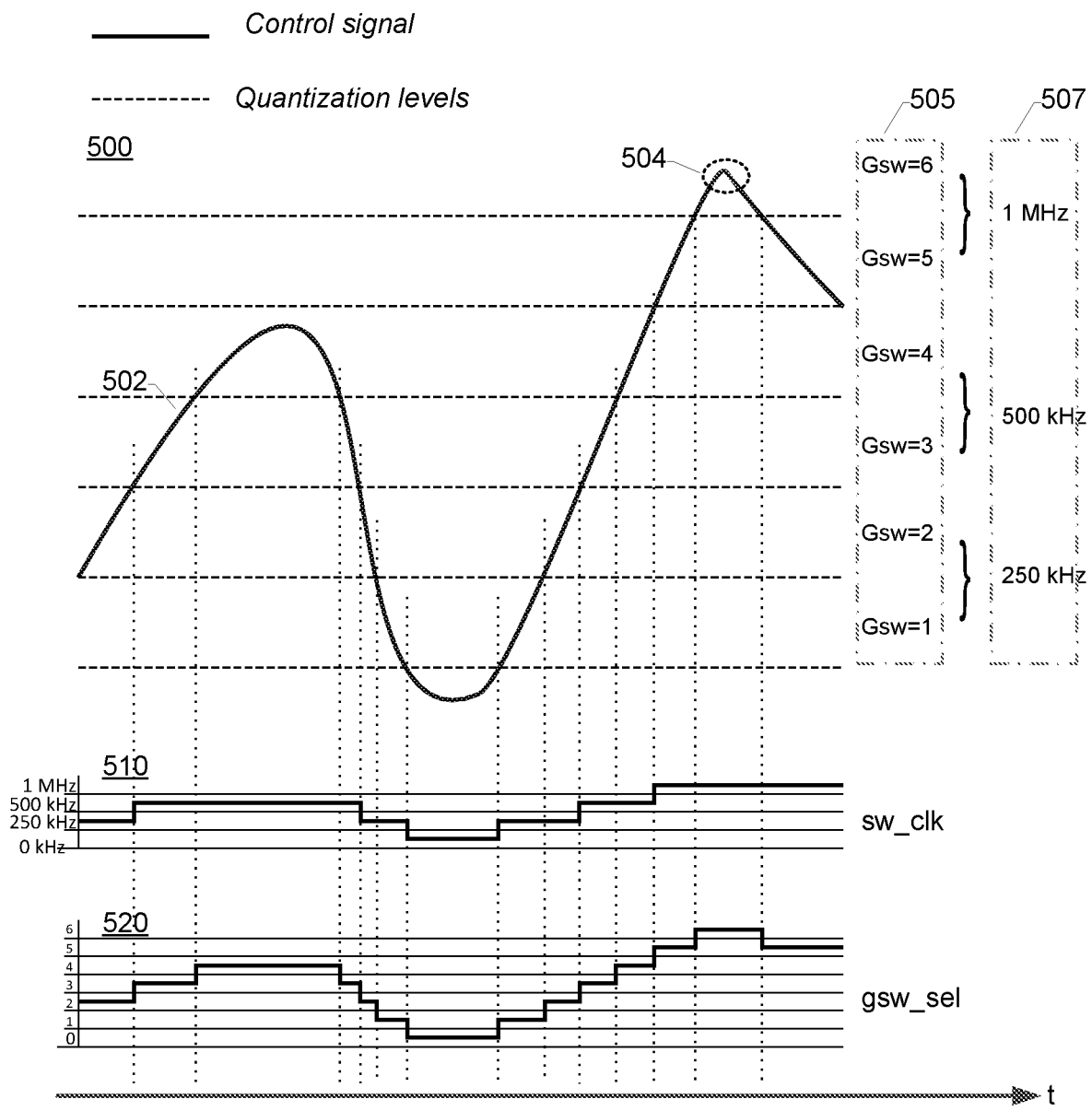
FIG. 5 shows a waveform of a lowpass filtered control signal generated by a first output voltage regulator embodiment of the exemplary SC DC-DC converter.
Figure 6:
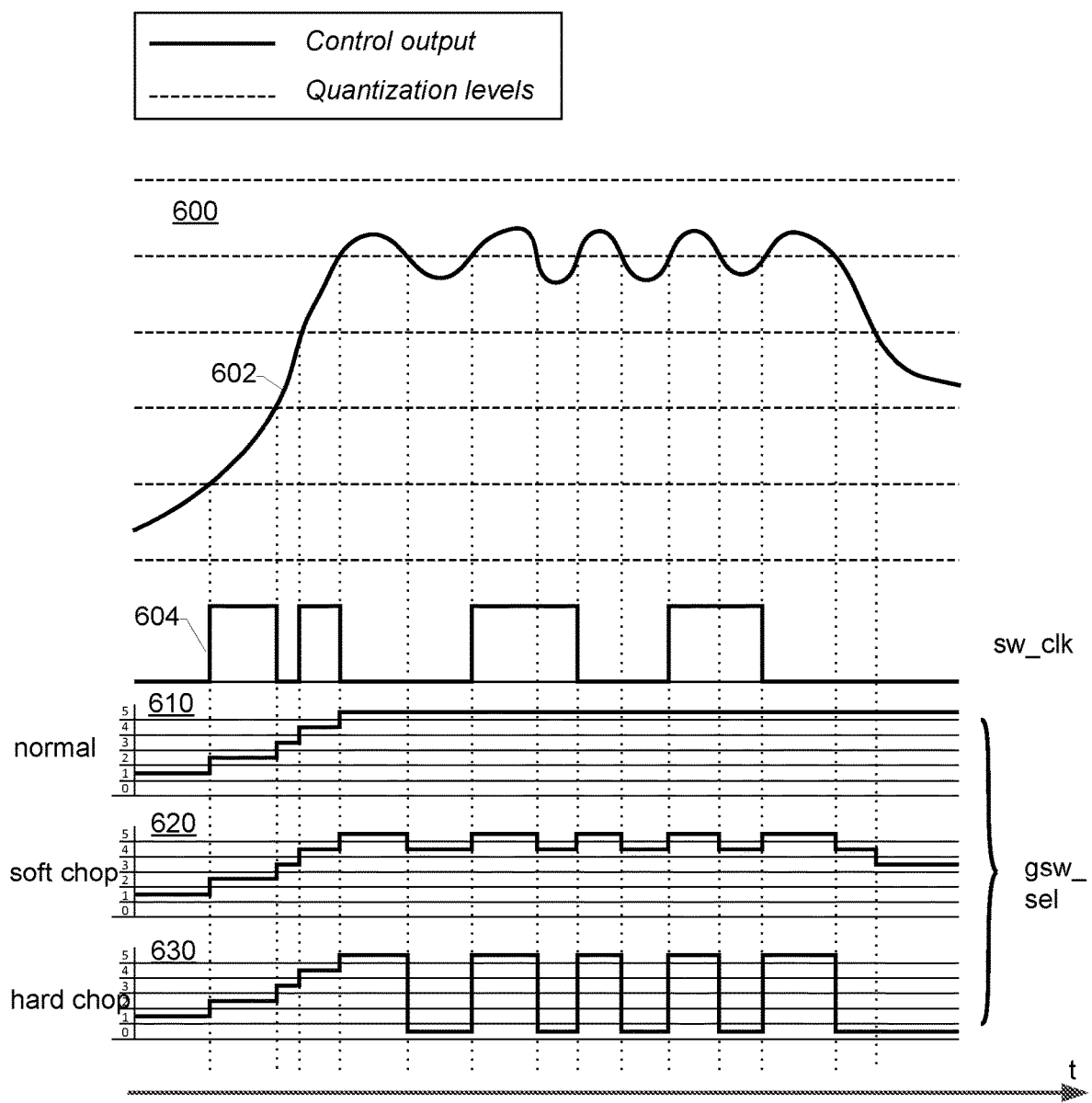
FIG. 6 shows a waveform of a lowpass filtered control signal generated by a second output voltage regulator embodiment of the exemplary switched capacitor SC DC-DC converter.

FIG. 5 shows on graph 500 an exemplary waveform 502 of the lowpass filtered control signal εL "Control signal" generated by the output voltage regulator 401a illustrated on FIG. 9A). The output voltage regulator 401a comprises an eight-level quantizer or A/D converter. Each of the semiconductor switches, e.g. SW1, SW2, SW3 and SW4, of the charge pump circuit comprises eight individually controllable switch segments. The output voltage regulator 401a comprises an adjustable/programmable clock generator (not shown) configured to generate a predefined set of fixed clock frequencies consisting at least of clock frequencies 250 kHz, 500 kHz and 1 MHz. The eight quantization levels of the eight-level quantizer are illustrated by horizontal dotted lines on graph 500 and the corresponding selection of the subset of individually controllable switch segments are indicated at column 505 where Gsw6 correspond to six active switch segments and Gsw2 correspond to two active switch segments etc. Graph 520 also illustrates the dynamic or adaptive subset selection of individually controllable switch segments carried out by the output voltage regulator 401a in dependence of the varying level of the lowpass filtered control signal εL where the y-axis shows how the number of active switch segments varies over time.

Graph 510 illustrates the dynamic or adaptive selection of the clock frequency carried out by the output voltage regulator 401a in dependence of the varying level of the lowpass filtered control signal εL. The instantaneous clock frequency selection is also indicated in column 507 illustrating how the clock frequency selection is coupled to a particular set or sets of active switch segments, i.e. five or six active switch segments Gsw5, Gw4 is coupled to the highest 1 MHz clock frequency and so on. The adjustable clock frequency/switching frequency of the output voltage regulator 401a provides a flexible adaptation mechanism of the DC-DC converter to changing load conditions such that a high switching frequency may be selected under heavy load conditions and a low switching frequency under light load conditions for the benefit of minimizing switching losses in the first, second, third and fourth controllable semiconductor switches SW1, SW2, SW3 and SW4 as well as other switched components of the DC-DC converter.

Figure 9B:
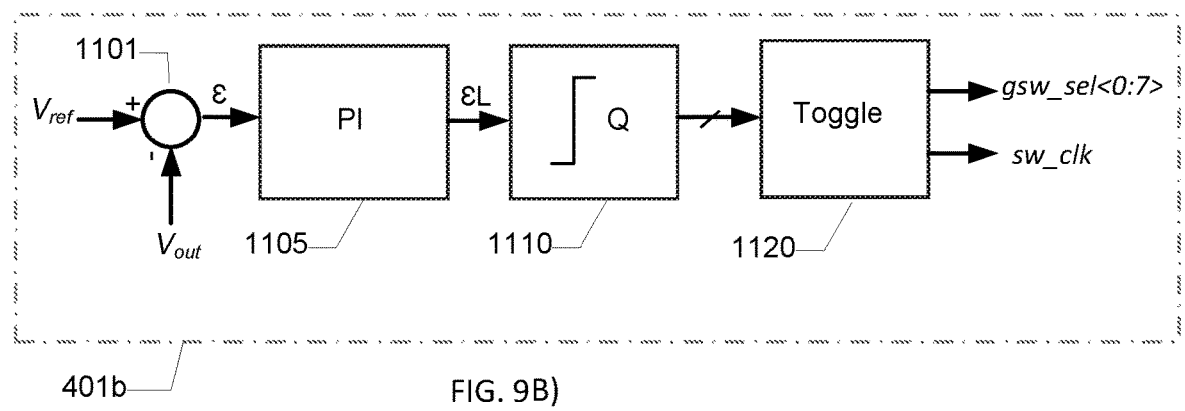

FIG. 9B) shows a simplified block diagram of a second embodiment of the output voltage regulator 401b. The output voltage regulator 401b comprises a number of corresponding circuit blocks to those discussed above such as an error signal generator, e.g. a subtraction circuit 1101, configured to subtract the DC reference voltage $V_{ref}$ indicating the target DC output voltage of the SC DC-DC converter 400 and the feedback voltage $V_{out}$ to determine a control signal or error signal ε. The output voltage regulator 401b also comprises a loop filter 1105, a multi-level quantizer 1110, i.e. A/D converter, configured to convert the lowpass filtered control signal εL into a corresponding digital control signal at a predetermined sampling frequency as discussed above. The output voltage regulator 401b comprises a digital switch array controller 1120 that implements a toggle triggered control scheme to the controllable semiconductor switches, e.g. SW1, SW2, SW3 and SW4, of the charge pump circuit via the switch segment select bus 404 (gsw_sel<0:7>) and the clock signal sw_clk. The digital switch array controller 1120 is configured to toggle only the clock signal sw_clk to the charge pump circuit when it is necessary. The digital switch array controller 1120 is configured to use a minimum switch conductance of each of the controllable semiconductor switches for a current clock or switching frequency. This control mechanism provides a non-repetitive waveform of the clock signal sw_clk 625 generated by the output voltage regulator 401b such that the frequency spectrum of the clock signal varies with time and is difficult to estimate or control.

Graph 600 shows an exemplary waveform 602 of the lowpass filtered control signal εL "Control output" generated by the output voltage regulator 401b illustrated on FIG. 9B). The output voltage regulator 401b comprises an eight-level quantizer or A/D converter. Each of the semiconductor switches, e.g. SW1, SW2, SW3 and SW4, of the charge pump circuit comprises eight individually controllable switch segments. The eight quantization levels of the eight-level quantizer are illustrated by horizontal dotted lines on graph 600 and the corresponding selection of the subset of individually controllable switch segments are indicated graphs 610, 620 and 630 where the number of active switch segments, and thereby increasing switch conductance, are indicated on the y-axis. The x-axis shows time to illustrate how the number of active switch segments changes over time. Graphs 610, 620 and 630 shows different operating conditions of the output voltage regulator 401b designated "normal", "soft chop" and "hard chop. In the "normal" mode, the digital switch array controller only acts when the lowpass filtered control signal εL "Control signal" waveform 602 crosses a quantization level in upwards direction. When the lowpass filtered control signal exceeds the quantization level, the clock is toggled and the switch conductance associated with the just passed quantization level is turned on. No conductance switching is on the other hand carried when the lowpass filtered control signal again falls below a quantization level which leads to a low power consumption as the switch segments only switches very rarely. In the hard "chop" mode depicted on graph 630 and the soft chop mode depicted on graph 620, downwards crossing of a quantization level of the lowpass filtered control signal is utilized. This extra information can be used to decrease the charge transfer to the load. The clock signal 604 (sw_clk) is toggled in response to the detection of a rising crossing of a quantization level of the lowpass filtered control signal. However, often this toggle leads to too much charge being transferred to the load and the DC output voltage will therefore often exceed the desired or target DC output voltage by a certain amount. This will make the lowpass filtered control signal decrease a fraction. In these "chopping" modes the digital switch array controller will respond by reducing the charge transfer to the charge pump circuit using this extra information of the falling crossing of a quantization level. In response to a downward crossing of a quantization level in the "soft chop" mode, the switch controller switches off the switch segment with highest conductance of ones currently on, or just anyone of the switch segments if they have identical conductance, to reduce the charge transfer. In response to a downward crossing of a quantization level in the "hard chop" mode, the controller turns off all the switch segments. However, in general any number of the individual switch segments could be turned off in response to a downward crossing of a quantization level.

Figure 9C:
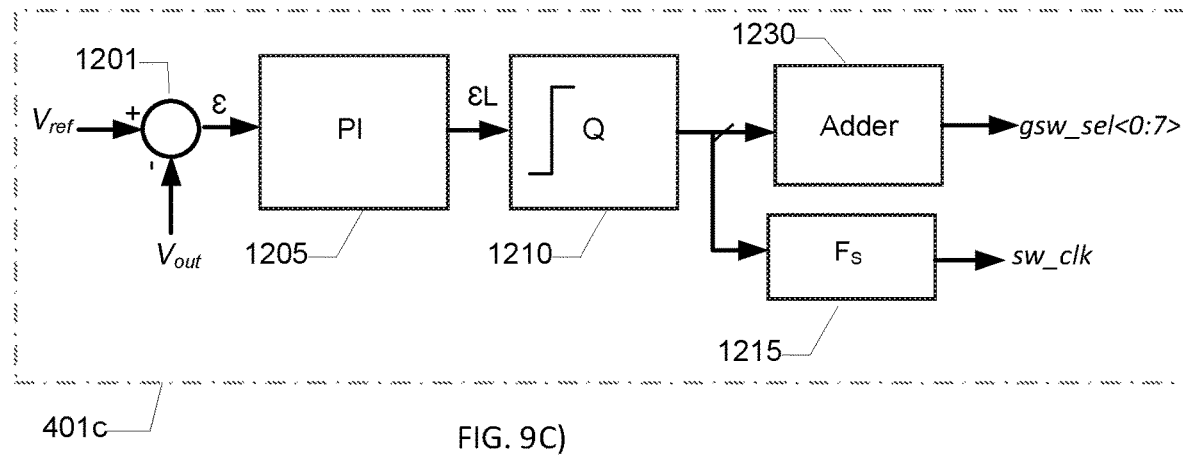

FIG. 9C) shows a simplified block diagram of a third embodiment of the output voltage regulator 401c. The output voltage regulator 401c comprises a number of corresponding circuit blocks to those discussed above such as an error signal generator, e.g. a subtraction circuit 1201, configured to subtract the DC reference voltage $V_{ref}$ indicating the desired or target DC output voltage of the SC DC-DC converter 400 and the feedback voltage Vout to determine a control signal or error signal ε. The output voltage regulator 401 also comprises a loop filter 1205, a multi-level quantizer 1210, i.e. A/D converter, configured to convert the lowpass filtered control signal εL into a corresponding digital control signal at a predetermined sampling frequency as discussed above. The output voltage regulator 401c comprises a digital switch array controller or adder 1230 that implements a binary weighted control scheme. The digital switch array controller 1230 can select the eight, or any other practical integer number, individually controllable switch segments weighted as binary numbers to provide 2N possible switch conductance values where N is the number of individual switch segments of each of the controllable semiconductor switches of the charge pump circuit. This control mechanism or scheme provides a significantly better conductance resolution for the controllable semiconductor switches, e.g. SW1, SW2, SW3 and SW4, and may eliminate certain shortcomings caused by a more limited conductance resolution of the above discussed first and second embodiments of the output voltage regulator 401a, 401b using merely eight possible conductance values. The digital switch array controller or adder 1230 is clocked at a fixed or variable adder clock frequency. According to exemplary embodiment of the digital switch array controller, the clock frequency can be adjusted between a fixed set of individual clock frequencies comprising 2 MHz, 1 MHz, and 500 kHz. At the 2 MHz clock frequency, the switch conductance value, Gsw, of each of the controllable semiconductor switches may be updated on both rising and falling edge of the clock signal. This provides minimal voltage ripple on the DC output voltage and an accurate output voltage regulation. A reduction of the clock frequency to e.g. 1 MHz or 500 kHz will lead to larger ripple voltage but with the benefit of reduced power dissipation in the multi-level quantizer.

Figure 7:
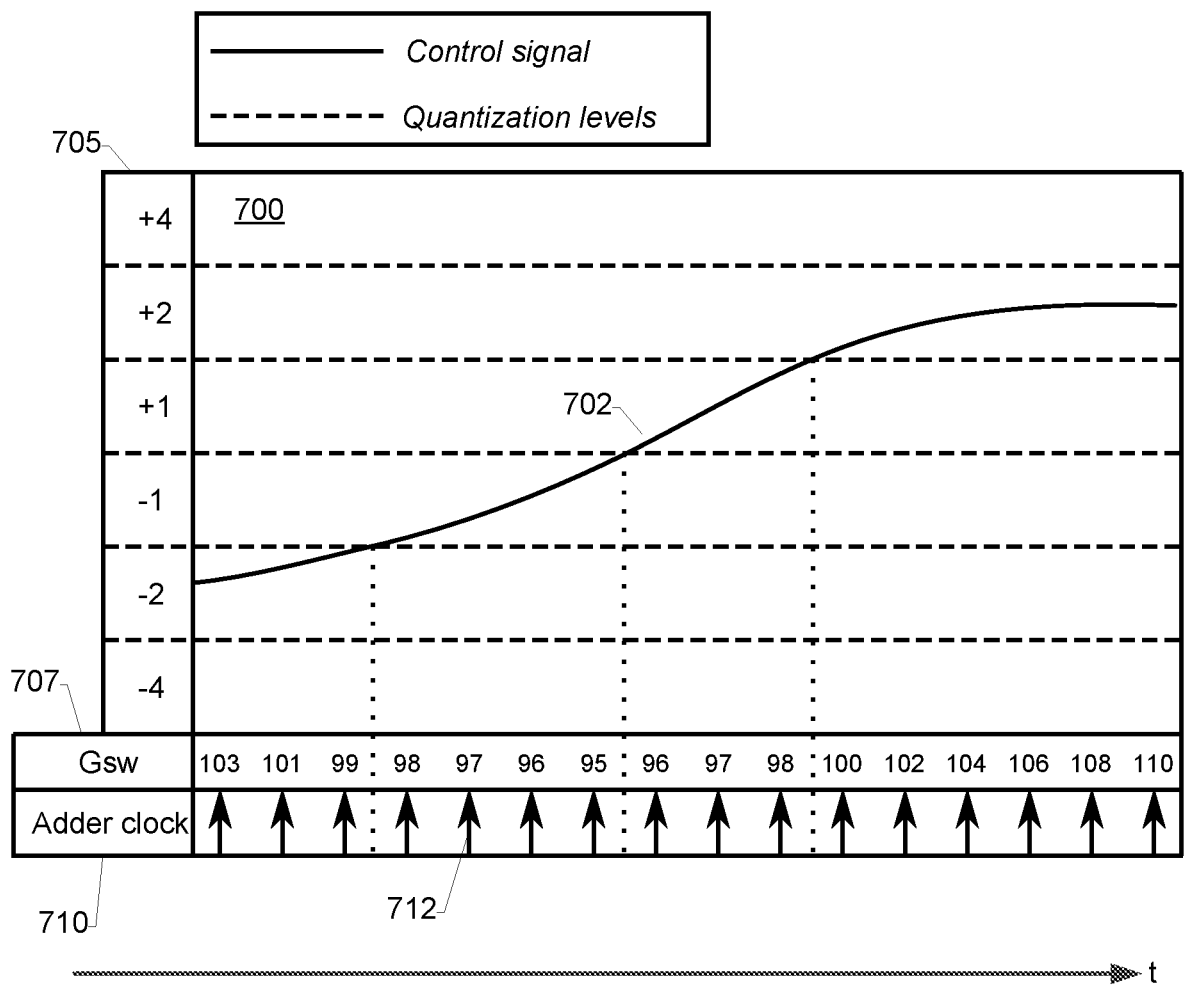
FIG. 7 shows a waveform of a lowpass filtered control signal generated by a third output voltage regulator embodiment of the exemplary switched capacitor (SC) DC-DC converter.
Figure 8:
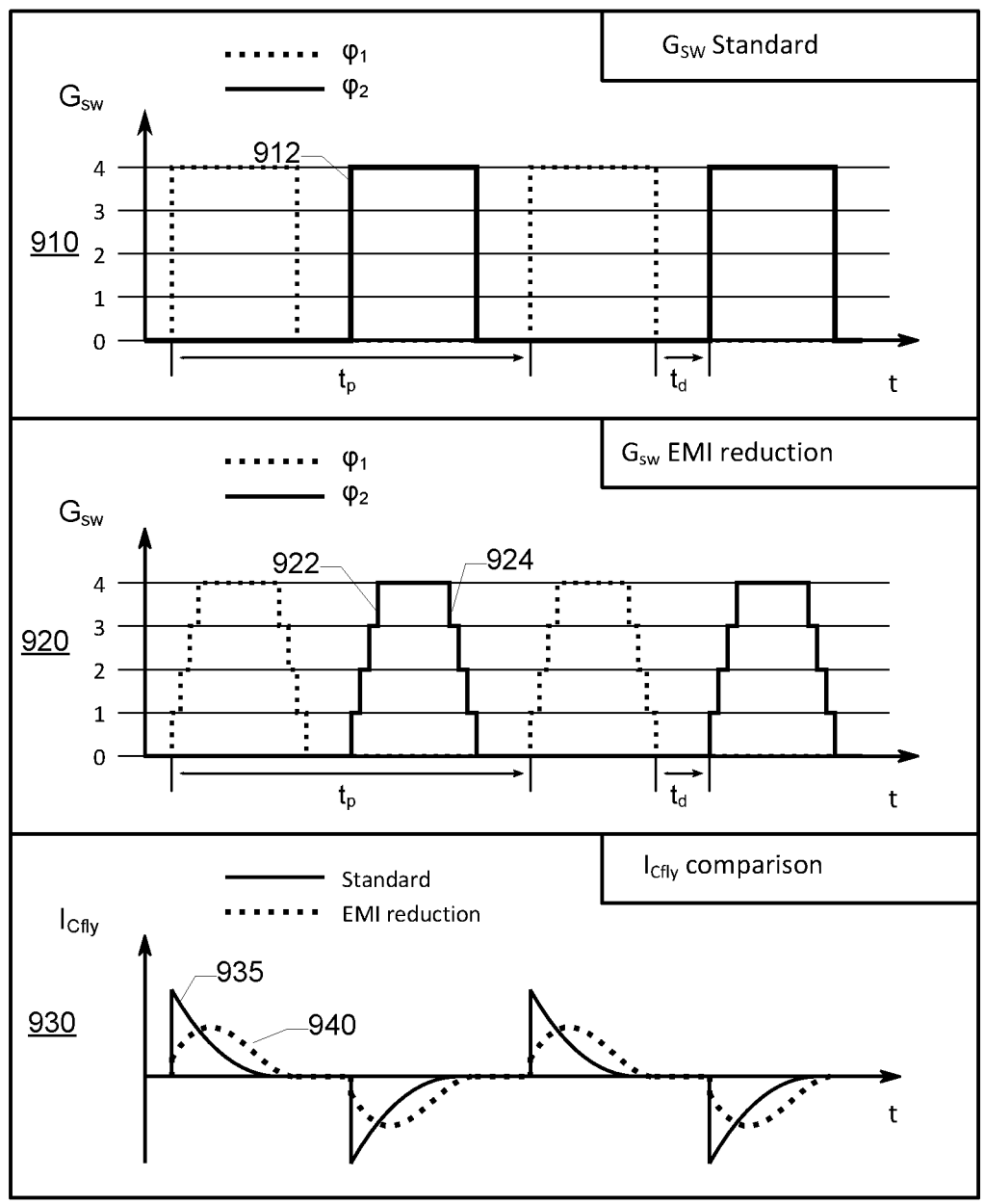
FIG. 8 illustrates the operation of a fourth embodiment of the output voltage regulator comprising a segmented switch structure with sequential turn-on and turn-off of the individually controllable switch segments, FIG. 9A) shows a simplified block diagram of the first output voltage regulator embodiment of the exemplary SC DC-DC converter, FIG. 9B) shows a simplified block diagram of the second output voltage regulator embodiment of the exemplary SC DC-DC converter.

FIG. 7 shows on graph 700 an exemplary waveform 702 of the lowpass filtered control signal εL "Control signal" generated by the output voltage regulator 401c illustrated on FIG. 9C) comprising an exemplary eight-level quantizer. Each of the semiconductor switches SW1, SW2, SW3 and SW4 of the charge pump circuit comprises eight binary weighted individually controllable switch segments leading to 255 individually selectable switch conductance values, $G_{sw}$, of each of the first, second, third and fourth controllable semiconductor switches. The output voltage regulator 401c may also comprise a clock frequency selector 1215 which selects the frequency of the clock signal sw_clk generated at the output voltage regulator 401a. The clock frequency selector 1215 is configured to generate a predefined set of fixed clock frequencies e.g. consisting at least of clock frequencies 250 kHz, 500 kHz and 1 MHz. A subset of the quantization levels of the multi-level quantizer are illustrated by horizontal dotted lines on graph 700 and the amplitude of the digital control signal determines the conductance value that is added to or subtracted from a current conductance value of the each of the controllable semiconductor switches by the adder 1230. The illustrated embodiment uses the conductance values +1/+2/+4 and −1/−2/−4 as indicated by column 705, but this election of conductance levels may be different in other embodiments. The additions carried out by digital switch array controller or adder 1230, at the predetermined adder clock frequency, are indicated by the set of vertical arrows 712 below the row 707 showing the correspondingly computed conductance values, e.g. "103, "101", "98" etc., of each of the controllable semiconductor switches.

The output voltage regulator 401c is configured to select a current clock frequency $F_s$ of the clock signal sw_clk based on a current switch conductance of each of the first, second, third and fourth controllable semiconductor switches SW1, SW2, SW3 and SW4 using a relatively simple mapping rule such as:

$G_{sw}$ between 1 and 100>$F_s$=250 kHz;
$G_{sw}$ between 101 and 200>$F_s$=500 kHz;
$G_{sw}$ between 201 and 256>$F_s$=1 MHz;

The digital switch array controller may be adapted to implement a simple mapping rule to ensure that the output voltage regulator 401c increases both the clock frequency and the switch conductance for increasing amplitude of the digital control signal and vice versa. A certain value (e.g. +/−1, 2, 4) may for example be added in each adder clock period. When a certain threshold for the switch conductance value Gsw is reached, the switch controller switches to a higher or lower clock frequency. If the switch conductance value is held constant and the clock frequency Fsw is suddenly doubled a very large reduction of output resistance of the converter is introduced within a single adder period. This is typically an undesirable effect and the switch array controller may therefore be configured to switch reduce the current value of the switch conductance in response to switching to a higher clocking frequency. A corresponding scheme may be implemented by the switch array controller when jumping to a lower clock frequency. For example if the switch conductance value is constant and the clock frequency is halved, a large increase of the output resistance results. This increase of output resistance may be compensated by increasing the switch conductance value by an appropriate amount in response to the clock frequency reduction.

FIG. 9 illustrates the operation of a fourth embodiment of the output voltage regulator 401 via graphs 910, 920 and 930. The output voltage regulator 401 comprises a digital switch array with a segmented structure of the controllable semiconductor switches of the charge pump circuit 100, 200 similar to anyone of the previously discussed first, second and third embodiments of the output voltage regulator 401. Each of the controllable semiconductor switches of the charge pump circuit may comprise between 2 and 16 individually controllable switch segments driven by respective sets of switch segment control signals as discussed above. Graph 910 illustrates the ordinary waveforms of the first and second clock phases $\phi_1$, $\phi_2$ of the clock signal driving at least one of, and preferably all of, the controllable semiconductor switches of the charge pump circuit. As illustrated all switches of a particular subset of the eight individually controllable switch segments for each semiconductor switch are turned-on substantially at the same time leading to an abrupt change of switch conductance—for example at rising edge 912 of the second clock phase where the switch conductance $G_{sw}$ abruptly changes from zero to 4 where the latter value indicates that an exemplary subset of four individually controllable switch segments are simultaneously turned-on by the output voltage regulator 401.

Graph 920 illustrates waveforms of the first and second clock phases $\phi_1$, $\phi_2$ of the clock signal driving at least one of, and preferably all of, the controllable semiconductor switches of the charge pump circuit in accordance with the fourth embodiment of the output voltage regulator. Each of the controllable semiconductor switches is turned-on and turned-off in a gradual or stepped manner by sequentially turn-on and turn-off the plurality, e.g. eight, of the individually controllable switch segments. The plurality of individually controllable switch segments of a particular controllable semiconductor switch may be switched between on and off states by a corresponding set of switch segment control signals. As illustrated at rising waveform edge 922 of the second clock phase $\phi_2$, the switch conductance $G_{sw}$ changes gradually from zero to 4 in a step-wise fashion where each step indicates the activation of an additional switch segment of the controllable semiconductor switch in question. Hence, each of the controllable semiconductor switches is turned-on gradually or stepwise, e.g. in four discrete steps, as illustrated, by introducing a suitable time delay between the switch segment control signals. Likewise, as illustrated by falling waveform edge 924 of the second clock phase $\phi_2$, the switch conductance $G_{sw}$ changes gradually from four and down-to zero in a correspondingly step-wise manner where each step indicates the deactivation or switch off of an additional switch segment. The time delay between two adjacent switch segment control signals will vary depending on various design factors such the number of individually controllable switch segments. In some embodiments, the time delay between two adjacent switch segment control signals may correspond to about 0.04-0.4% of the period time $t_p$ of the first or second clock phase such that the total turn on time and turn off time of a controllable switch mat lie between 0.28-2.8% of the period time $t_p$ for an eight segment switch. The period time $t_p$ of the first or second clock phase may lie between 0.5 µs and 4 µs corresponding to a clock or switching frequency of the voltage pump circuit between 125 kHz and 2 MHz.

Graph 930 illustrates schematically current waveforms $I_{Cfly}$ of the current flowing into and out of the flying capacitor or capacitors of the charge pump circuit where a first waveform 935 shows the flying capacitor current for the switch segment selection scheme on graph 910. The second (dotted line) current waveform 940 shows the flying capacitor current using the sequential turn-on scheme for switch segments illustrated on graph 920 where the switch conductance $G_{sw}$ changes gradually over time in accordance with the fourth embodiment of the output voltage regulator. The second flying capacitor current waveform 940 has markedly reduced rate of change, dI/dt, compared to the first flying capacitor current waveform 935. This feature leads to a significant reduction of emitted high-frequency magnetic and electrical noise associated with the second flying capacitor current waveform 940 leading to improved EMI properties of the fourth embodiment of the SC DC-DC converter 400 compared to the comparable implementations of the first, second and third embodiments discussed above. Hence, facilitating integration of the present SC DC-DC converter embodiment with other electronic circuits and antenna structures, in particular for compact portable communication devices such as hearing instruments.

Although particular embodiments have been shown and described, it will be understood that they are not intended to limit the present inventions, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

The invention claimed is:

1. A hearing instrument comprising:
   a rechargeable battery source providing a battery supply voltage;
   a switched capacitor DC-DC converter comprising a DC input configured to receive the battery supply voltage, wherein the converter is configured for converting the battery supply voltage into a higher or lower DC output voltage; and
   at least one active circuit configured to receive the DC output voltage for energizing active components of the at least one active circuit;
   wherein the switched capacitor DC-DC converter comprises a charge pump circuit comprising a switch array driven by first and second clock phases derived from a clock signal.

2. The hearing instrument according to claim 1, wherein the least one active circuit comprises a class D output amplifier.

3. The hearing instrument according to claim 2, further comprising a control and processing circuit comprising:
   a first audio input channel for receipt of a first audio signal, and
   a signal processor for processing of the first audio signal for generating a compensated microphone signal according to a hearing loss of a user;
   wherein the compensated microphone signal is for application to an audio input of the class D output amplifier for generation of a modulated output signal at a predetermined modulation frequency for application to a receiver or speaker.

4. The hearing instrument according to claim 1, wherein the switched capacitor DC-DC converter also comprises a clock generator configured to generate the clock signal.

5. The hearing instrument according to claim 1, wherein the switch array is configured to, in the first clock phase, charge a capacitor and, in the second clock phase, discharge the capacitor.

6. The hearing instrument according to claim 1, wherein the switched capacitor DC-DC converter further comprises an output voltage regulator.

7. The hearing instrument according to claim 6, wherein the output voltage regulator comprises a reference voltage input for receipt of a DC reference voltage, and a feedback voltage input for receipt of a feedback voltage representative of the DC output voltage.

8. The hearing instrument according to claim 6, wherein the output voltage regulator further comprises an error signal generator configured to combine a DC reference voltage and a feedback voltage to determine a control signal.

9. The hearing instrument according to claim 8, wherein the output voltage regulator further comprises a loop filter configured for lowpass filtering the control signal to generate a lowpass filtered control signal.

10. The hearing instrument according to claim 9, wherein the output voltage regulator further comprises a multi-level quantizer configured to convert the lowpass filtered control signal into a corresponding digital control signal at a predetermined sampling frequency.

11. The hearing instrument according to claim 6, wherein the output voltage regulator further comprises a switch array controller configured to generate the first and second clock phases for the charge pump circuit based on the clock signal and a digital control signal.

12. The hearing instrument according to claim 6, further comprising a clock generator, wherein the clock generator is configured to generate a predefined set of fixed clock frequencies.

13. The hearing instrument according to claim 12, wherein the output voltage regulator is configured to select a clock frequency from the predefined set of fixed clock frequencies in accordance with a predetermined modulation frequency of a class D output amplifier.

14. The hearing instrument according to claim 13, wherein each clock frequency of the predefined set of fixed clock frequencies is an integer multiple of the predetermined modulation frequency of the class D output amplifier.

15. The hearing instrument according to claim 13, wherein the clock signal of the switched capacitor DC-DC converter is synchronous to another clock signal that sets the predetermined modulation frequency of the class D output amplifier.

16. The hearing instrument according to claim 1, wherein the rechargeable battery source comprises at least one Li-Ion battery cell.

17. The hearing instrument according to claim 1, wherein the switched capacitor DC-DC converter further comprises a multi-level quantizer, and wherein a predetermined sampling frequency of the multi-level quantizer is equal to two times a clock frequency of the clock signal.

18. The hearing instrument according to claim 1, wherein the switch array of the charge pump circuit comprises a first controllable semiconductor switch and a second controllable semiconductor switch configured to be driven by the first clock phase, and wherein the switch array also comprises a third controllable semiconductor switch and a fourth controllable semiconductor switch configured to be driven by the second clock phase.

19. The hearing instrument according to claim 18, wherein the first and second controllable semiconductor switches respectively comprise a first plurality of individually controllable switch segments and a second plurality of individually controllable switch segments driven respectively by first and second sets of switch segment control signals derived from the first clock phase; and
wherein the third and fourth controllable semiconductor switches respectively comprise another a third plurality of individually controllable switch segments and a fourth plurality of individually controllable switch segments driven respectively by third and fourth sets of switch segment control signals derived from the second clock phase.

20. The hearing instrument according to claim 19, wherein the output voltage regulator is configured to, for one or more of the first, second, third and fourth controllable semiconductor switches, select respective one(s) of the first, second, third, and fourth plurality of individually controllable switch segments in accordance with an amplitude of a digital control signal.

21. The hearing instrument according to claim 19, wherein the output voltage regulator is configured to:
switch between an on-state and an off-state of the first controllable semiconductor switch by sequentially turning-on and turning-off the first plurality of individually controllable switch segments via the first set of switch segment control signals; and/or
switch between an on-state and an off-state of the second controllable semiconductor switch by sequentially turning-on and turning-off the second plurality of individually controllable switch segments via the second set of switch segment control signals; and/or
switch between an on-state and an off-state of the third controllable semiconductor switch by sequentially turning-on and turning-off the third plurality of individually controllable switch segments via the third set of switch segment control signals; and/or
switch between an on-state and an off-state of the fourth controllable semiconductor switch by sequentially turning-on and turning-off the fourth plurality of individually controllable switch segments via the fourth set of switch segment control signals.

22. The hearing instrument according to claim 6, wherein the output voltage regulator is configured to switch between individual clock frequencies of a predefined set of fixed clock frequencies in accordance with an amplitude of a digital control signal.

* * * * *